US008431434B2

(12) United States Patent
Tessler et al.

(10) Patent No.: US 8,431,434 B2
(45) Date of Patent: Apr. 30, 2013

(54) DERIVATIZED FULLERENE-BASED DOPANTS FOR ORGANIC SEMICONDUCTORS

(75) Inventors: Nir Tessler, Zikhron-Yaakov (IL); Olga Solomeshch, Nesher (IL)

(73) Assignee: Technion Research & Development Foundation Limited, Haifa (IL)

( * ) Notice: Subject to any disclaimer, the term of this patent is extended or adjusted under 35 U.S.C. 154(b) by 120 days.

(21) Appl. No.: 13/062,964

(22) PCT Filed: Sep. 9, 2009

(86) PCT No.: PCT/IL2009/000879

§ 371 (c)(1),
(2), (4) Date: Mar. 9, 2011

(87) PCT Pub. No.: WO2010/029542

PCT Pub. Date: Mar. 18, 2010

(65) Prior Publication Data

US 2011/0156019 A1 Jun. 30, 2011

Related U.S. Application Data

(60) Provisional application No. 61/136,486, filed on Sep. 9, 2008.

(51) Int. Cl.
*H01L 51/40* (2006.01)

(52) U.S. Cl.
USPC ................. 438/99; 438/46; 257/40; 257/642; 257/E51.001; 257/E51.024

(58) Field of Classification Search .................... 438/46, 438/99; 257/40, 642, E51.001, E51.024
See application file for complete search history.

(56) References Cited

U.S. PATENT DOCUMENTS

| | | | | |
|---|---|---|---|---|
| 8,017,863 | B2 * | 9/2011 | Forrest et al. | 136/263 |
| 2002/0189666 | A1 | 12/2002 | Forrest et al. | |
| 2007/0181874 | A1 | 8/2007 | Prakash et al. | |
| 2008/0213620 | A1 | 9/2008 | Kim et al. | |
| 2010/0207114 | A1 * | 8/2010 | Koenemann et al. | 257/40 |

FOREIGN PATENT DOCUMENTS

| | | |
|---|---|---|
| EP | 1209708 | 5/2002 |
| WO | WO 2007/121252 | 10/2007 |
| WO | WO 2010/029542 | 3/2010 |

OTHER PUBLICATIONS

International Search Report and the Written Opinion Dated Mar. 1, 2010 From the International Searching Authority Re.: Application No. PCT/IL2009/000879.

Blochwitz et al. "Low Voltage Organic Light Emitting Diodes Featuring Doped Phthalocyanine as Hole Transport Material", Applied Physics Letters, 73(6): 729731, Aug. 10, 1998.

Boltalina et al. "Preparation of C60F36 and C70F36/38/40", Chemical Communications, p. 529-530, 1996.

Brown et al. "Optical Spectroscopy of Field-Induced Charge in Self-Organized High Mobility Poly(3-Hexylthiophene)", Physical Review B, 63: 125204-1-125204-11, 2001.

(Continued)

*Primary Examiner* — Andy Huynh

(57) ABSTRACT

Methods for producing p-doped organic semiconductor material with a fullerene derivative having at least one electron-withdrawing substituent covalently attached thereto, and semiconductor compositions prepared thereby are provided. Also provided are electronic devices, such as transistors, solar-cells, illuminating devices, OLEDs and detectors, comprised of these p-doped organic semiconductor materials.

24 Claims, 5 Drawing Sheets

OTHER PUBLICATIONS

Dai et al. "Doping of Conducting Polymers by Sulfonated Fullerene Derivatives and Dendrimers", Journal of Physical Chemistry B, 102(21): 4049-4053, 1998.

De Leeuw et al. "Stability of N-Type Doped Conducting Polymers and Consequences for Polymeric Microelectronic Devices", Synthetic Metals, 87: 53-59, 1997.

De Mello et al. "An Improved Experimental Determination of External Photoluminescence Quantum Efficiency", Advanced Materials, 9(3): 230-232, 1997.

Hettich et al. "Determination of the Electron Affinities of Fluorinated Fullerenes (C60F44,46, C70F52,54) by Fourier Transform Mass Spectrometry", International Journal of Mass Spectrometry and Ion Processes, XP026508042, 138: 263-274, Oct. 13, 1994. Abstract.

Liu et al. "Electrochemical Properties of C60F36", Synthetic Metals, 86(1-3): 2289-2290, 1997.

Mitsumoto et al. "Electronic Structures and Chemical Bonding of Fluorinated Fullerenes Studied by NEXAFS, UPS, and Vacuum-UV Absorption Spectroscopies", Journal of Physical Chemistry A, XP002568837, 102(3): 552-560, Jan. 15, 1998. Fig.13, Abstract.

Pfeiffer et al. "Controlled Doping of Phthalocyanine Layers by Cosublimation With Acceptor Molecules: A Systematic Seebeck and Conductivity Study", Applied Physics Letters, 73(22): 3202-3204, Nov. 30, 1998.

Rincón et al. "Molecular Films Based on Polythiophene and Fullerol: Theoretical and Experimental Studies", Solar Energy Materials & Solar Cells, 87(1-4): 33-47, 2005.

Sariciftci et al. "Semiconducting Polymers (as Donors) and Buckminsterfullerene (as Acceptor): Photoinduced Electron Transfer and Heterojunction Devices", Synthetic Metals, 59: 333-352, 1993.

Shaked et al. "Charge Density and Film Morphology Dependence of Charge Mobility in Polymer Field-Effect Transistors", Advanced Materials, 15(11): 913-916, Jun. 5, 2003.

Solomeshch "Ground-State Interaction and Electrical Doping of Fluorinated C60 in Conjugated Polymers", Advanced Materials, 21: 1-5, 2009.

Sque et al. "Transfer Doping of Diamond: The Use of C60 and C60F36 to Effect P-Type Surface Conductivity", Physica B, 376-377: 268-271, 2006.

Walzer et al. "Highly Efficient Organic Devices Based on Electrically Doped Transport Layers", Chemical Reviews, 107(4): 1233-1271, 2007.

Wöbkenberg et al. "Fluorine Containing C60 Derivatives for High-Performance Electron Transporting Field-Effect Transistors and Integrated Circuits", Applied Physics Letters, 92: 143310-1-143310-3, 2008.

Yu et al. "P-Type Doping in Organic Light Emitting Diodes Based on Fluorinated C60", Journal of Applied Physics, 104: 124505-1-124505-3, 2008.

International Preliminary Report on Patentability Dated Mar. 24, 2011 From the International Bureau of WIPO Re.: Application No. PCT/IL2009/00879.

Communication Pursuant to Article 94(3) EPC Dated May 31, 2012 From the European Patent Office Re. Application No. 09787560.3.

* cited by examiner

FIG. 3
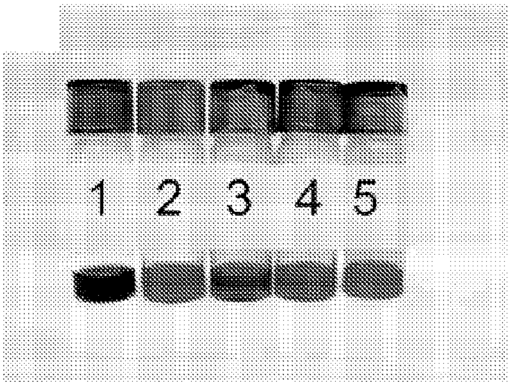
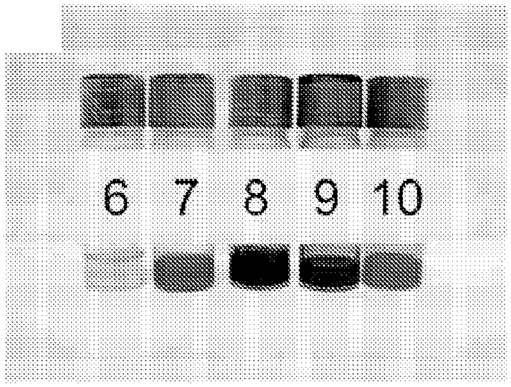
FIG. 3A
FIG. 3B
FIG. 4
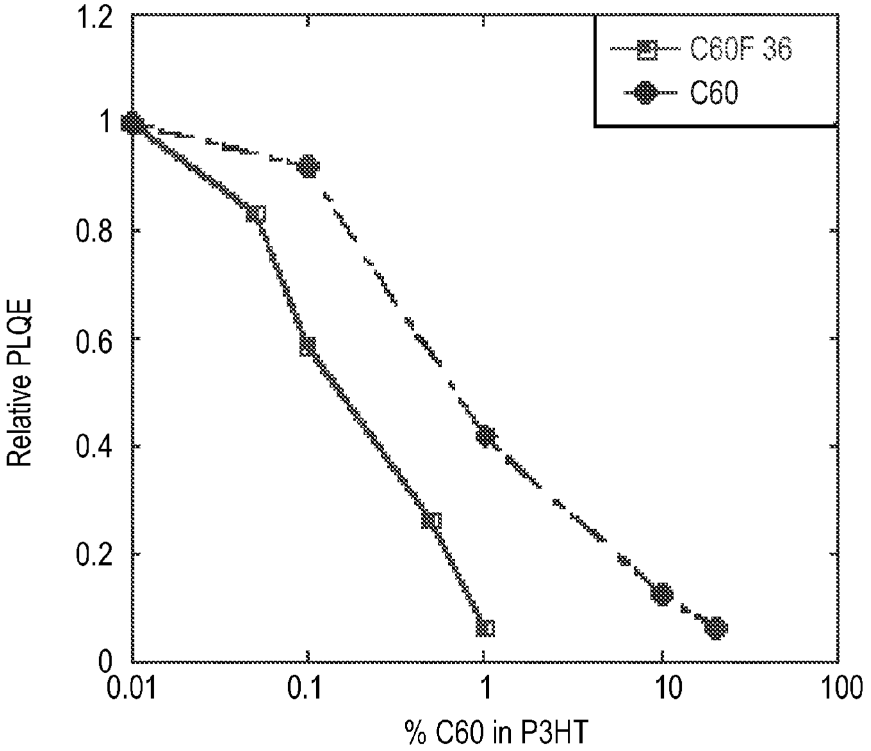

FIG. 5
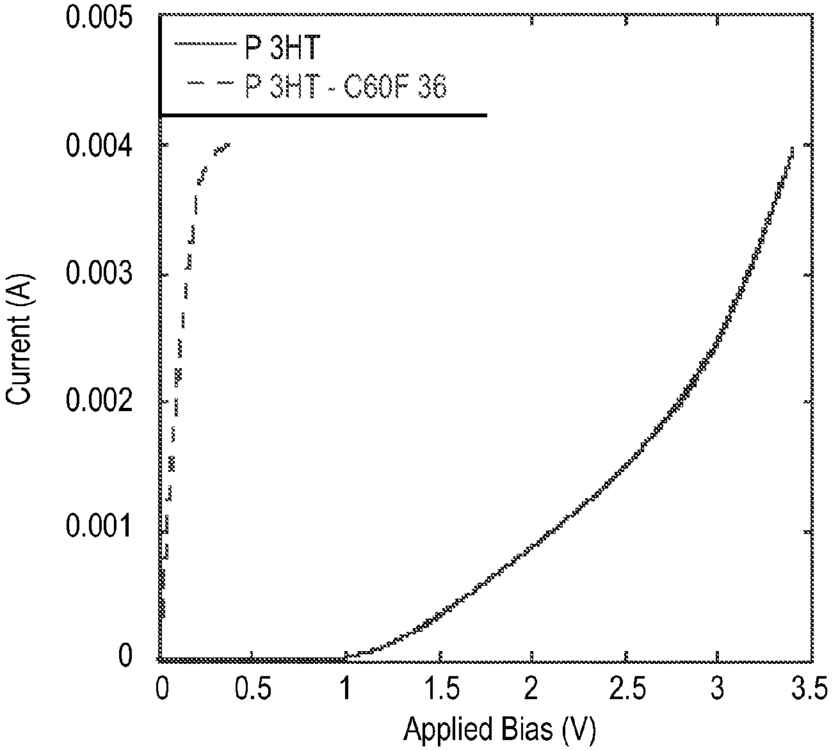
FIG. 6
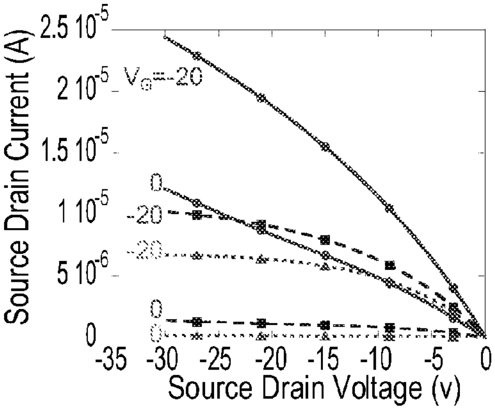
FIG. 6A
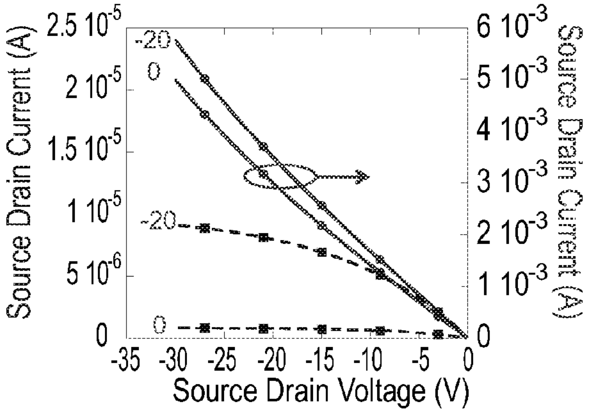
FIG. 6B

Triarylamine BCP PVK-Cin Peptide

Poly-TPD

DERIVATIZED FULLERENE-BASED DOPANTS FOR ORGANIC SEMICONDUCTORS

RELATED APPLICATIONS

This application is a National Phase of PCT Patent Application No. PCT/IL2009/000879 having International filing date of Sep. 9, 2009, which claims the benefit of priority of U.S. Provisional Patent Application No. 61/136,486 filed on Sep. 9, 2008. The contents of the above applications are all incorporated herein by reference.

FIELD AND BACKGROUND OF THE INVENTION

The present invention, in some embodiments thereof, relates to applied materials and more particularly, but not exclusively, to novel dopants of organic semiconductors.

Organic semiconductors (OSCs) are taking an ever growing part in the field of advanced electronics. OSCs are organic materials that have semiconductor properties, namely an electrical conductivity between that of typical metals and that of insulating compounds. Organic semiconductors can take the form of single molecules, short chain oligomers and long chain polymers, such as aromatic hydrocarbons, which include pentacene, anthracene and rubrene as semiconductive small molecules, and poly(3-hexylthiophene), poly(p-phenylene vinylene), F8BT, polyacetylene and derivatives thereof as semiconductor oligomers and polymers.

The electron carriers in polymeric OSCs (organic semiconductors in the form of oligomers and polymers) include π-electrons and unpaired electrons, which allow electrons to dislocate via π-electron cloud overlaps, while in charge transfer complexes, quasi-stable unpaired electrons are the charge carriers. Another charge transfer mechanism in OSC is also obtained by pairing an electron donor molecule with an electron acceptor molecule. According to the terms used in the field, a current is generated by the movement of an electron (denoted "n" for negative) or a "hole" (denoted "p" for positive). The presence of electrons or holes, which are termed n-type or p-type semiconductor material, respectively, is the basis for any conductivity of a semiconductor. Junctions between regions of n- and p-type semiconductors create electric fields or electronic-band offsets which are essential for a range of semiconductor-based electronic devices.

The intrinsic electrical properties of semiconductors can be augmented and adjusted by introducing chemical impurities thereto; a process known as doping.

Unlike some occurrences in the literature of the term "doping" in the context of semiconductors, that use it to denote mixing of small amounts of one substance into a bulk of another substance without effecting a specific augmentation of electrical conductivity but rather effect color, morphology, ion transfer and other physicochemical phenomena, the term "doping", as used herein and is known in the art, exclusively refers to the protocol of electrical doping where the doping results in the enhancement of charge carrier density in the doped semiconductor material, as oppose to general "mixing" where no electrical doping occurs.

Dopants can be added to preparations of semiconductor substances so as to modify their electrical conductivity. Addition of dopant may result, in some cases, in OSCs that exhibit electrical conductivity nearly as some metals. Depending on the kind of dopant, a doped region of a semiconductor is altered in the number of electrons or holes. The term "n+" is used for n-type dopant, and the term "p+" is used for p-type dopant. Density differences in the amount of impurities also produce small electric fields in the region which is used to accelerate non-equilibrium electrons or holes.

The electrical conductivity of organic semiconductors is strongly influenced by doping. Organic semiconductor matrix materials may be made up either of compounds with good electron-donor properties or of compounds with good electron-acceptor properties. Thus, doping of any semiconductor, and particularly doping of OSCs, has an effect on the electronic performance of a semiconductor primarily by elevating the charge carrier density and hence also, in some cases, the effective charge carrier mobility.

In addition to permanent modification through doping, the conductivity/resistance of semiconductors can be modified dynamically by applying electric fields and other sources of external energy such as electromagnetic energy (light), thermal energy (heat) and magnetism. The ability to control resistance/conductivity in regions of semiconductor material dynamically through the application of external energy sources is probably one of the main applicable features of semiconductors. This capacity has led to the development of a broad range of semiconductor devices such as transistors and diodes. Semiconductor devices that have dynamically controllable conductivity, such as transistors, are the building blocks of integrated circuits devices like the microprocessor. These "active" semiconductor devices (transistors) are combined with passive components implemented from semiconductor material such as capacitors and resistors, to produce complete electronic circuits.

The control of conductivity via n- and p-type doping has been proving important in the realization of low voltage and efficient organic light-emitting diodes (OLEDs). Investigations of high quality and stable electrical doping have focused predominantly on small π-conjugated molecules by vapor diffusion and deposition with limited attention drawn to doping of solution processed conjugated polymers. One of the first reports of useful intentional p-doping made use of fluorinated TCNQ (tetrafluorotetracyano-quinodimethan, F-4-TCNQ) [1] which ever since seems to be the only π-conjugated p-dopant to be used commercially [2].

Several studies aimed at expanding the field of dopants for OSCs and methods of doping OSCs have been published and taught in, for example, U.S. Pat. Nos. 6,908,783 and 7,151,007, and U.S. Patent Application Nos. 20050040390, 20050061232, 20050121667, 20050139810, 20070145355, 20070215863 and 20070278479.

By electron transfer processes, strong electron acceptors such as tetracyanoquinonedimethane (TCNQ) or 2,3,5,6-tetrafluorotetracyano-1,4-benzoquinonedimethane (F-4-TCNQ, see Scheme 1 below) have become well known [1; 3] to produce so-called holes in electron donor-like base materials (hole-transport materials), owing to the number and mobility of which the conductivity of the base material is relatively significantly varied. For example, N,N'-perarylated benzidines TPD or N,N',N"-perarylated starburst compounds, including 4,4',4"-tris(N,N-diphenylamino)triphenylamine (TDATA, see, Scheme 1) and certain metal phthalocyanines, such as zinc phthalocyanine (ZnPc), are known as matrix materials with hole-transport properties.

Scheme 1

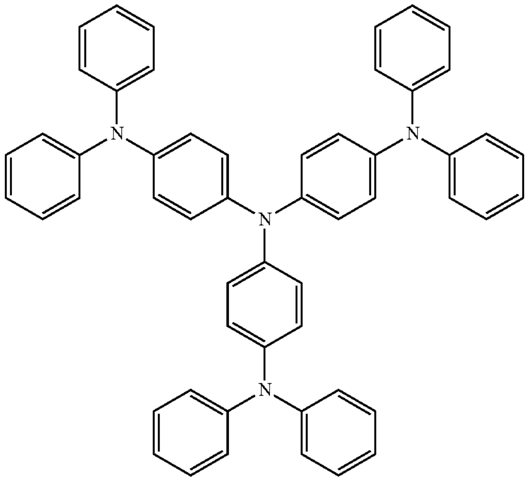

Matrix:
$N^1,N^1$-bis(4-(diphenylamino)phenyl)-$N^4,N^4$-diphenylbenzene-1,4-diamine (TDATA)

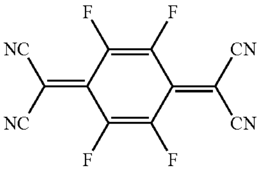

Dopant:
2,3,5,6-tetrafluorotatracyano-1,4-benzoquinonedimethane (F-4-TCNQ)

The compounds previously investigated have disadvantages for technical use in the production of doped semiconductor organic layers or of suitable electronic components with doped layers of this kind, since the manufacturing processes in large technical production plants, or those on a technical scale, cannot always be sufficiently precisely controlled. This leads to high control and regulation expense within the process in order to obtain the desired product quality, or to undesirable tolerances of the products.

In addition, there are disadvantages in the use of previously known organic donors with regard to electronic component structures such as light-emitting diodes (OLEDs), field-effect transistors (FETs) or solar cells themselves, since the said production difficulties in the handling of dopants may result in undesirable heterogeneities in the electronic components or undesirable aging effects of the electronic components.

At the same time, however, care has to be taken to see that the dopants to be used have appropriate electron affinities and other properties suitable for the particular application, since, for example, under certain conditions the dopants also help to determine the conductivity or other electrical properties of the organic semiconductor layer.

Fullerenes and derivatives thereof have been used in the context of semiconductors and OSCs both as a substance for the OSC matrix as well as for doping surfaces of inorganic semiconductors.

For example, U.S. Pat. No. 7,358,538 teaches organic light-emitting devices with multiple hole injection layers containing fullerene as the OSC matrix, wherein the layered structures include a bi-layered structure including an electrically conductive layer serving as electrical contact to external circuit and a fullerene layer sandwiched between the conductive layer and a hole transport layer.

U.S. Patent Application No. 20070278479 teaches n-doping of organic semiconductors, wherein fullerenes constitute the OSC material which is then n-doped by organometallic dopants such as bis(2,2'-terpyridine)ruthenium.

Wöbkenberg et al. [4] teach fluorine-containing $C_{60}$ fullerene derivatives, used as an OSC matrix for high-performance electron transporting field-effect transistors and integrated circuits.

Liming Dai et al. [5] teach the use of $C_{60}$ spherical fullerenes as carriers for (sulfonated) molecules which are used for p-doping of conducting polymers, namely produce a dendrimer-like molecular structure wherein the fullerene provides the center core of the dendrimer and thus acts as a physical carrier for the electrically active sulfonic molecules.

U.S. Pat. No. 7,371,479 teaches a method for producing fullerene derivatives, similar to those described by Liming Dai et al., from halogenated fullerenes as starting materials, which can be used as proton (positively charged hydrogen atoms or $H^+$) conductors and hence can be used in electrochemical devices.

Sque et al. [6] teach a doping method and semiconductor devices using the same, wherein fullerene derivatives are attached to the top surface of inorganic semiconductors layers in order to induce charge transfer from the molecule to the semiconductor top surface.

Rincóna et al. [7] report the electrical and optical properties of molecular films made of homogeneous and segregated mixtures of polythiophene (PT) with $C_{60}$ and $C_{60}(OH)_{24-28}$ compounds. This paper shows the importance of $C_{60}(OH)_{24-28}$ as a buffer layer between PEDOT:PSS (poly(3,4-ethylenedioxythiophene) poly(styrenesulfonate), a polymer mixture of two ionomers) and $C_{60}$-based films for enabling high quality films which are required for efficient solar cell operation.

Sariciftci et al. [8] teach the use of charge transfer in the excited state between semiconductor polymers and fullerenes in their mixed films and their use in solar cell applications.

SUMMARY OF THE INVENTION

According to one aspect of the present invention there is provided a method of manufacturing a semiconductor material, the method comprising doping an organic semiconductor material with a fullerene derivative having at least one electron-withdrawing substituent covalently attached thereto, and having a lowest occupied molecular orbital (LUMO) which is sufficient to allow electron transfer from a highest occupied molecular orbital (HOMO) of the organic semiconductor material to the LUMO.

In some embodiments, the doping comprises mixing the organic semiconductor material with the fullerene derivative in solution so as to obtain a mixture thereof.

In some embodiments, the method further comprises applying the mixture onto a substrate by a procedure selected from the group consisting of spin-coating, printing, vaporizing, dipping, and doctor-blading. In some embodiments, the doping is effected by vapor deposition.

In some embodiments, the doping comprises co-evaporating and depositing the organic semiconductor material and the fullerene derivative from two separate sources onto a substrate.

In some embodiments, the doping comprises vapor depositing the fullerene derivative onto a pre-applied layer of the organic semiconductor material.

According to another aspect of the present invention there is provided a semiconductor composition, comprising an organic semiconductor material doped with a fullerene derivative having at least one electron-withdrawing substituent covalently attached thereto, and having a lowest occupied molecular orbital (LUMO) which is sufficient to allow electron transfer from a highest occupied molecular orbital (HOMO) of the organic semiconductor material to the LUMO.

In some embodiments, the composition is in a liquid form.

According to another aspect of the present invention there is provided an electronic device comprising the composition described herein.

In some embodiments, the device is selected from the group consisting of an electrooptical device, a solar (photovoltaic) cell, a component of an integrated circuitry, an organic light-emitting diode (OLED), a thin film transistor (TFT), a field-effect transistor (FET), a TFT in flat panel display device, an element in a liquid crystal display (LCD) device, a radio-frequency identification (RFID) device and a detector/sensor device.

In some embodiments, an energy level of the LUMO of a derivatized fullerene is lower than an energy level of a LUMO of a non-derivatized fullerene by at least 0.5 eV.

In some embodiments, an energy level of the LUMO is less than 2 eV above an energy level of the HOMO of the organic semiconductor material.

In some embodiments, an energy level of the LUMO is less than 1 eV above an energy level of the HOMO of the organic semiconductor material.

In some embodiments, an energy level of the LUMO is less than 0.4 eV above an energy level of the HOMO of the organic semiconductor material.

In some embodiments, a ratio of the organic semiconductor material to the fullerene derivative ranges from about 50 to 50 percent by weight to about 99.99 to 0.01 percent by weight.

In some embodiments, a ratio of the organic semiconductor material to the fullerene derivative ranges from about 80 to 20 percent by weight to about 99.99 to 0.01 percent by weight.

In some embodiments, a ratio of the organic semiconductor material to the fullerene derivative ranges from about 90 to 10 percent by weight to about 99.99 to 0.01 percent by weight.

In some embodiments, the fullerene derivative has general Formula I:

$$C_nR_m \qquad \text{Formula I}$$

wherein n and m are integers representing the ratio of carbon atoms to R substituents in the fullerene;

R is an electron-withdrawing substituent such as, but not limited to, halogen, pseudohalogen, haloalkyl, haloalicyclic, haloaryl, haloheteroaryl, carbonyl, ester, aldehyde and any combination thereof; and wherein the fullerene is selected from the group consisting of a spherical fullerene, a tubular fullerene, a linear fullerene and a planar fullerene.

In some embodiments, the electron-withdrawing substituent is halogen and the fullerene derivative is a halogenated fullerene derivative (HFD).

In some embodiments, the halogenated fullerene derivative is a halogenated spherical fullerene derivative. In some embodiments, the halogenated spherical fullerene derivative is $C_{60}F_{36}$.

In some embodiments, the halogenated spherical fullerene derivative is $C_{70}F_{54}$.

In some embodiments, the organic semiconductor material is selected from the group consisting of phenanthroline, a substituted phenanthroline, 2,9-dimethyl-4,7-diphenyl-1,10-phenanthroline (BCP), triarylamine, a substituted triarylamine, polyvinylcarbazole (PVK), polyvinylcarbazole-cinnamate (PVK-Cin), poly[-bis(4-butylphenyl)-bis(phenyl) benzidine] (poly-TPD), poly(3-hexylthiophene-2,5-diyl), polyacene, polyphenylene, poly(phenylene vinylene), polyfluorene, anthracene, tetracene, chrysene, pentacene, pyrene, perylene, coronene, p-quaterphenyl (p-4P), p-quinquephenyl (p-5P), p-sexiphenyl (p-6P), poly(-substituted thiophene), poly(3,4-bisubstituted thiophene), polybenzothiophene, polyisothianapthene, poly(N-substituted pyrrole), poly(-substituted pyrrole), poly(3,4-bisubstituted pyrrole), polyfuran, polypyridine, poly-1,3,4-oxadiazoles, polyisothianaphthene, poly(N-substituted aniline), poly(-substituted aniline), poly (-substituted aniline), poly(2,3-bisubstituted aniline), 1,3,5-tris(diphenylamino)benzene, 1,3,5-tris(2-(9-ethylcabazyl-3) ethylene)benzene, 4,4'-bis(n-carbazolyl)-1,1'-biphenyl, copper(ii) phthalocyanine, tri-p-tolylamine, 7,7,8,8-tetracyanoquinodimethane, 8-hydroxyquinoline zinc, tris-(8-hydroxyquinoline)aluminum, polyazulene, polypyrene, a pyrazoline derivative; polyselenophene, polybenzofuran, polyindole, polypyridazine, a benzidine derivative, a stilbene derivative, a triazine derivative, a substituted metallo- or metal-free porphine derivative, a phthalocyanine derivative, a fluorophthalocyanine derivative, a naphthalocyanine derivative, a fluoronaphthalocyanine derivative and a fullerene derivative.

As used herein the term "about" refers to ±10%.

The terms "comprises", "comprising", "includes", "including", "having" and their conjugates mean "including but not limited to". The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a biomolecule" or "at least one biomolecule" may include a plurality of biomolecules, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

As used herein the term "method" refers to manners, means, techniques and procedures for accomplishing a given task including, but not limited to, those manners, means, techniques and procedures either known to, or readily developed from known manners, means, techniques and procedures by practitioners of the chemical, pharmacological, biological, biochemical and medical arts.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

The patent or application file contains at least one drawing executed in color. Copies of this patent or patent application publication with color drawing(s) will be provided by the Office upon request and payment of the necessary fee. Some embodiments of the invention are herein described, by way of example only, with reference to the accompanying drawings and images. With specific reference now to the drawings and images in detail, it is stressed that the particulars shown are by way of example and for purposes of illustrative discussion of embodiments of the invention. In this regard, the description taken with the drawings and images makes apparent to those skilled in the art how embodiments of the invention may be practiced.

In the drawings:

FIGS. 3A-B are color photographs of two sets of vials, wherein vial No. 1 contains $C_{60}$ (20 mg in 1 ml of DCB); vial No. 2 contains P3HT (20 mg in 1 ml of DCB); vial No. 3 contains P3HT (20 mg in 1 ml of DCB) mixed with $C_{60}$ (2 mg or 10% by weight); vial No. 4 contains P3HT (20 mg in 1 ml of DCB) mixed with $C_{60}$ (0.2 mg or 1% by weight); vial No. 5 contains P3HT (20 mg in 1 ml of DCB) mixed with $C_{60}$ (0.002 mg or 0.01% by weight); vial No. 6 contains an exemplary derivatized fullerene $C_{60}F_{36}$ (20 mg in 1 ml of DCB); vial No. 7 contains P3HT (20 mg in 1 ml of DCB); vial No. 8 contains P3HT (20 mg in 1 ml of DCB) doped with $C_{60}F_{36}$ (2 mg or 10% by weight); vial No. 9 contains P3HT (20 mg in 1 ml of DCB) doped with $C_{60}F_{36}$ (0.2 mg or 1% by weight); and vial No. 10 contains P3HT (20 mg in 1 ml of DCB) doped with $C_{60}F_{36}$ (0.002 mg or 0.01% by weight), and showing the effect of doping-induced enhanced absorption of visible light;

FIG. 4 present comparative plots, showing the photoluminescence quantum efficiency (PLQE) as a function of the amount of fullerene expressed in weight percents as measured for $C_{60}$ (dashed line and round symbols) and for an exemplary derivatized fullerene $C_{60}F_{36}$ (solid line and square symbols) in P3HT (the PLQE of the pristine P3HT was 6%, data not shown), and showing that $C_{60}F_{36}$ quenches the luminescence much faster as compared to the effect of $C_{60}$;

FIG. 5 presents comparative Current-Voltage (I-V) plots characteristic of P3HT (solid line) and doped P3HT (dashed line) as measured in an OSC-based diode device, and showing the typical turn on voltage observed for the pristine P3HT and that the device exhibited an almost complete short-circuit characteristics in the P3HT device doped with 10 weight percents of an exemplary derivatized fullerene $C_{60}F_{36}$;

FIGS. 6A-B present the output characteristics used at gate voltages of $V_{GS}$=0 and $V_{GS}$=−20V of three TFT devices which are based on pristine P3HT (dotted line and triangle symbols in FIG. 6A), the same mixed with 0.1 weight percent of $C_{60}$ (dashed line and square symbols in FIG. 6A) and the same doped with 0.1 weight percent of $C_{60}F_{36}$ (full line and circle symbols in FIG. 6A), and the output characteristics of a TFT device based on P3HT mixed with 10 weight percents of $C_{60}$ (dashed line and square symbols in FIG. 6B) and the same doped with 10 weight percent of $C_{60}F_{36}$ (full line and circle symbols in FIG. 6B), and showing that $C_{60}$ mixing has a slight effect (which is independent of the weight percent thereof) on the TFT characteristics, as compared to the pronounced effect which is observed when $C_{60}F_{36}$ is used as a dopant in the TFT device, and further showing the conductivity of the sample doped with 10% $C_{60}F_{36}$ in P3HT is three orders of magnitude higher than that of the pristine P3HT TFT at the ON state

DESCRIPTION OF EMBODIMENTS OF THE INVENTION

Figure 1A:
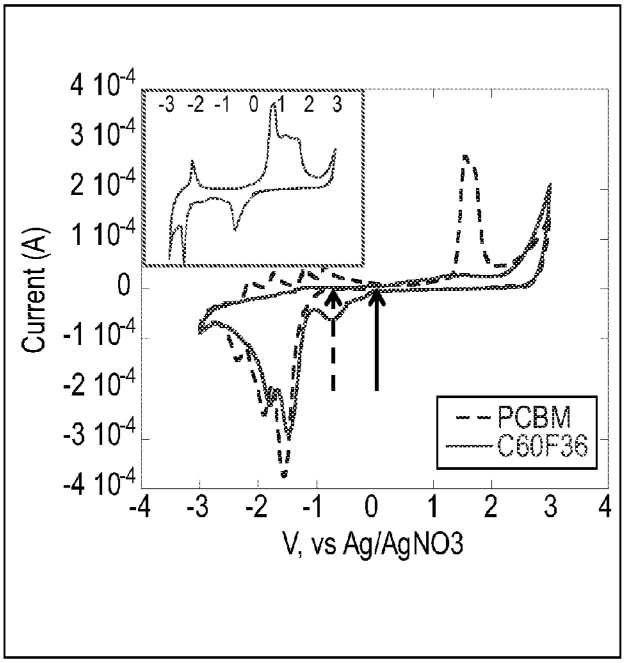
FIGS. 1A-B present cyclic voltammograms of [6,6]-phenyl-$C_{61}$-butyric acid methyl ester (PCBM, dashed line in FIG. 1A), and of an exemplary derivatized fullerene $C_{60}F_{36}$ (solid line in FIG. 1A), showing the onset of the reduction wave, or the LUMO level (marked by an arrow in FIG. 1A for the two compounds), and the cyclic voltammograms of poly(3-hexylthiophene-2,5-diyl) (P3HT, insert in FIG. 1A), and the HOMO and LUMO levels (solid line in FIG. 1B) of the isolated compounds $C_{60}$, PCBM, $C_{60}F_{36}$ and P3HT.

The present invention, in some embodiments thereof, relates to applied materials and more particularly, but not exclusively, to novel dopants of organic semiconductors.

Before explaining at least one embodiment of the invention in detail, it is to be understood that the invention is not necessarily limited in its application to the details set forth in the following description or exemplified by the Examples. The invention is capable of other embodiments or of being practiced or carried out in various ways.

An electro-physical characteristic of an organic semiconductor (OSC) is expressed by its highest occupied molecular orbital (HOMO) value, which corresponds to the valence band in an inorganic semiconductor, and its lowest unoccupied molecular orbital (LUMO) value, which corresponds to the conduction band in an inorganic semiconductor. The difference of the energies of the HOMO and LUMO is equivalent to the band gap of inorganic semiconductors, which serves as a measure of the excitability of the molecule or system. A system which is characterized by a small band gap requires a smaller dose of energy to be excited. In general, the band gap depends on pressure and temperature because of thermal effects such as expansion, orientation and order. This temperature and pressure dependence is more pronounced in OSCs, as compared to inorganic semiconductors.

For inorganic semiconductors, the distinction between semiconductors and insulators is typically defined in terms of the band gap. Semiconductors can be regarded as a type of insulator with a low band gap, while insulators with a higher band gap, usually greater than 3 eV, are not considered semiconductors and generally do not exhibit semiconductive behavior under practical conditions. For organic semiconductors (OSC), one would typically use the existence of bond-conjugation or of π-electrons to define a material as semiconductor. It is understood that electron availability for transport (current or charge mobility) plays a role in determining a material's electro-physical classification, particularly in OSCs.

As mentioned hereinabove, the availability of electrons (or holes) in OSC's can be affected by doping. OSCs can be doped by adding chemical reactants to alter the redox state of the system so as to push electrons into the conducting orbitals within the semiconductive system. OSCs can be doped by a propagative redox reaction, which is effected by chemical doping, namely the exposure of the OSC to an oxidant, such as iodine or bromine, or a reductant, such as an alkali metal. OSCs can also undergo electrochemical doping, namely applying an electric potential difference so as to cause charged species, such as ions in an electrolyte, to enter the OSC in the form of electron addition (n-doping) or removal (p-doping).

P-type doping is effected by the addition of electron acceptor species that can accept electron from the OSC in its ground (non-excited) state, namely, the LUMO of the acceptor receives electrons from the HOMO of the OSC. The capacity of the dopant to accept electrons in the ground state depends largely on the energy difference between the OSC's HOMO and the dopant's LUMO. These criteria are fundamentally different from cases wherein electrons are transferred in the excited state which only requires that the LUMO of the acceptor lies below the LUMO of the OSC. The acceptor taking electrons from the OSC HOMO provides excess holes to the OSCs, which increase the hole carrier concentration (p0) of the OSC, thereby creating a p-type semiconductor. As opposed to n-type semiconductors, p-type semiconductors have a larger hole concentration than electron concentration. As used herein, the phrase "p-type" refers to the positive charge of the hole in the OSC. In p-type semiconductors, holes are the majority carriers, while electrons are the minority carriers.

In essence, doping of an OSC is a process which effects the elevation of the charge carrier density and, as a result, may also affect the effective charge carrier mobility in the OSC material. This elevation of the charge carrier density and mobility is achieved when the dopant has a LUMO at a level which is sufficient to allow electron transfer from the HOMO of the OSC material to the LUMO of the dopant.

Fullerenes typically have a LUMO level that is below OSC's LUMO level and hence are known excited-state acceptors (as in typical solar-cell applications).

While conceiving the present invention, the present inventors have considered the ground-state electron accepting characteristics of halogenated fullerenes and other fullerene derivatives having electron-withdrawing groups attached thereto, and envisioned that these electron acceptor species can be used as highly effective ground-state acceptors or p-type dopants for OSCs.

Heretofore, halogenated fullerene derivatives and other fullerene derivatives having electron-withdrawing groups attached thereto were not used as electronic dopants of bulk semiconductors, and not at all in organic semiconductors.

The present inventors hypothesized that such fullerene derivatives can be tailor-made for use for doping of OSCs, so as to have adequate LUMO levels with respect to a variety of OSCs, and thus to have a beneficial effect on the electronic performance of a semiconductor, primarily by elevating the charge carrier density and the effective charge carrier mobility. While further conceiving the present invention, it was realized that p-type doping of solution-processed OSCs can be accomplished more effectively with soluble or dispersible suitably derivatized fullerene-based dopants, thus circumventing cumbersome electrochemical, redox or vapor-based doping methods.

While reducing the present invention to practice, the fluorinated $C_{60}$ fullerene derivative $C_{60}F_{36}$ [9], was selected as an exemplary p-dopant. This molecule possesses high yet controllable number of fluorine atoms, which induce large shifts in the position of the energy levels of the $C_{60}$ core. The $C_{60}$ core is known to have several acceptor levels.

While further reducing the present invention to practice, it was found that the shift of the LUMO level of $C_{60}F_{36}$ with respect to $C_{60}$, enhances significantly the ground state interaction with conjugated polymer-type OSC, such as the solution-processed poly(3-hexylthiophene-2,5-diyl) (P3HT), thus leading to efficient doping of the polymer, namely the electron transfer from the P3HT HOMO to the $C_{60}F_{36}$ LUMO. This exemplary OSC system was successfully prepared and the beneficial doping effect was characterized using absorption spectrum, PL quenching, and field effect transistor measurements, thus providing the proof that derivatized fullerenes, such as fluorinated $C_{60}$, can be used successfully as a new class of tunable dopants for organic electronics, including those which are based on solution-processes polymers.

It has further been shown that $C_{60}F_{36}$ can also be used effectively a p-type dopant for other OSC such as triarylamine, polyvinylcarbazole-cinnamate (PVK-Cin) and poly [-bis(4-butylphenyl)-bis(phenyl)benzidine] (poly-TPD).

Hence, some embodiments of the present invention concern fluorinated fullerene-based dopants for doping organic semiconductors, which are easier to handle in the production process and which result in electronic components whose organic semiconductor materials are capable of being produced reproducibly.

Thus, according to one aspect of the present invention, there is provided a method (process) of manufacturing a semiconductor material. The method comprises doping an organic semiconductor material (OSC) with a fullerene derivative having at least one electron-withdrawing substituent covalently attached thereto.

The term "doping", as used in the context of embodiments of the present invention, refers exclusively to a process of electrical doping of a semiconductor, that is, a process in which the number of free charge carriers is increased, and as a result, elevation of the charge carrier density in the doped semiconductor material is effected. The term "doping", as defined herein, is as opposed to general "mixing" of small amounts of one substance into large amounts of another substance without effecting electrical doping.

As used herein, the term "p-doping" refers to doping of a semiconductor with a substance ("dopant") which is capable of accepting weakly-bound outer electrons from the semiconductor material. Thus p-doping, wherein "p" denotes positive, is a process of doping a semiconductor with an acceptor material, or p-type dopant, which forms "holes", or positive charges, in the semiconductor.

As used herein, the phrase "organic semiconductor material" or "organic semiconductor" (OSC), refers to an organic material that has semiconductor properties, namely an electrical conductivity between that of typical metals and that of insulating compounds, and includes materials of substantially one species of small (as opposed to oligomers and polymers) π-conjugated and/or aromatic molecules or a mixture thereof, short chain oligomers and long chain polymers of π-conjugated and/or aromatic hydrocarbons, as well as mixtures and co-polymers thereof.

The core organic semiconductor molecule (monomers in a polymer or non-polymeric compounds), according to embodiments of the present invention, can further be substituted in one or more positions therein. When substituted, the substituent can be, for example, an alkyl, an alkenyl, an alkynyl, a cycloalkyl, an aryl, a heteroaryl, a halide, a hydroxyl and an alkoxy, as these terms are defined herein.

Non-limiting examples of aromatic molecules include phenanthroline, 2,9-dimethyl-4,7-diphenyl-1,10-phenanthroline (BCP), pentacene, anthracene and rubrene (5,6,11,12-tetraphenylnaphthacene) and derivatives thereof.

Non-limiting examples of π-conjugated and/or aromatic polymers include triarylamine and substituted triarylamine; poly(thiophene) and poly(substituted thiophen), such as the exemplary poly(3-hexylthiophene) and poly(3-hexylthiophene-2,5-diyl); polyvinylene and poly(substituted vinylene), such as the exemplary poly(p-phenylene vinylene); polyvinylcarbazole (PVK) and polyvinylcarbazole-cinnamate (PVK-Cin); and other exemplary conjugated polymers such as benzidine derivatives such as poly[-bis(4-butylphenyl)-bis(phenyl)benzidine] (poly-TPD), poly(9,9-di-n-octylfluorene-co/alt-benzothiadiazole) (F8BT), polyacetylene and derivatives, co-polymers, alternating-polymers and mixtures thereof.

Other non-limiting examples of OSC materials include polyacene, polyphenylene, poly(phenylene vinylene), polyfluorene, anthracene, tetracene, chrysene, pentacene, pyrene, perylene, coronene, p-quaterphenyl (p-4P), p-quinquephenyl (p-5P), p-sexiphenyl (p-6P), poly(-substituted thiophene), poly(3,4-bisubstituted thiophene), polybenzothiophene, polyisothianapthene, poly(N-substituted pyrrole), poly(-substituted pyrrole), poly(3,4-bisubstituted pyrrole), polyfuran, polypyridine, poly-1,3,4-oxadiazoles, polyisothianaphthene, poly(N-substituted aniline), poly(-substituted aniline), poly(-substituted aniline), poly(2,3-bisubstituted aniline), 1,3,5-tris(diphenylamino)benzene, 1,3,5-tris(2-(9-ethylcabazyl-3)ethylene)benzene, 4,4'-bis(n-carbazolyl)-1,1'-biphenyl, copper(ii) phthalocyanine, tri-p-tolylamine, 7,7,8,8-tetracyanoquinodimethane, 8-hydroxyquinoline zinc, tris-(8-hydroxyquinoline)aluminum, polyazulene, polypyrene, a pyrazoline derivative; polyselenophene, polybenzofuran, polyindole, polypyridazine, a benzidine derivative, a stilbene derivative, a triazine derivative, a substituted metallo- or metal-free porphine derivative, a phthalocyanine derivative, a fluorophthalocyanine derivative, a naphthalocyanine derivative, a fluoronaphthalocyanine derivative and a fullerene derivative.

Other conjugated or partially conjugated light-emissive organic materials, suitable for use as OSC materials include, poly-phenylene-vinylene (PPV), substituted-PPV and PPV-derivatives such as di-alkoxy or di-alkyl derivatives and/or related PPV co-polymers, poly(-methoxy-5(2'-ethyl)hexyloxyphenylene-vinylene) (MEH-PPV) polyfluorenes and/or co-polymers incorporating polyfluorene segments. Alternative materials include organic molecular light-emitting materials such as tris(8-hydroxyquinoline)aluminium (Alq3), LDS-821, or any other small sublimed molecule or conjugated polymer electroluminescent material as known in the art. Yet other suitable light-emissive organic materials, suitable for use as OSC materials can be found in, for example, WO 90/13148 and U.S. Pat. No. 4,539,507, the contents of which are incorporated herein by reference. The light emitted by the device may be inside or outside the visible spectral range (400-800 nm).

The fullerene derivative having at least one electron-withdrawing substituent covalently attached thereto is selected so as to suit the selected organic semiconductor material, in terms of the energy levels thereof, as discussed herein.

As used herein, the term "fullerene" describes a compound belonging to a family of carbon allotropes, or molecules composed entirely of carbon. Fullerenes are characterized by linked pentagonal, hexagonal and heptagonal rings, wherein the non-hexagonal elements are responsible for the concavity or non-planarity of the compounds or parts thereof. According to the present embodiments, a fullerene can take the form of a hollow sphere (a "buckyball" or buckyball clusters, referred to herein as a "spherical fullerene"), such as $C_{60}$; "nano-onions" which are spherical molecular entities based on multiple spherical carbon layers surrounding a spherical core; oviform (egg-shaped) fullerenes which constitute an intermediate morphology between spherical fullerenes and tubular fullerenes; tubular ("buckytubes" or cylindrical) fullerenes which are known as "carbon nanotubes" and include closed or open hollow tubes having single or multiple walls, and megatubes, having walls of different thickness; polymers including chain-like (linear) structures, two-dimensional and three-dimensional polymers, chains and plane (such as graphene); linked "ball-and-chain" multimeric fullerenes such as dimers having two spherical fullerenes linked by a carbon chain; and fullerene rings.

The phrase "spherical fullerene", as used herein, refers to a fullerene compound which is characterized by consisting substantially of carbon and forms a closed spherical structure, and having, for example, 20 and more carbon atoms. Thus, a spherical fullerene, according to some embodiments, can have 20, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, 150, 152, 154, 156, 158, 160, 162, 164, 166, 168, 170, 172, 174, 176, 178, 180, 182, 184, 186, 188, 190, 192, 194, 196, 198, 200, 202, 204, 206, 208, 210, 212, 214, 216, 218, 220, 222, 224, 226, 228, 230, 232, 234, 236, 238 or 240 carbon atoms or more in all possible arrangements of carbons and in all possible symmetry-related isomers (non-isomorphic forms). For additional information regarding nomenclature and classification of fullerenes, see, Cozzi, F., et al., © 2005 IUPAC: *Pure Appl. Chem.*, Vol. 77, No. 5, pp. 843-923, 2005.

According to some embodiments, the spherical fullerene is a $C_{60}$ "buckyball" fullerene, consisting of 60 carbon atoms.

According to some embodiments, the fullerene consists of 70 carbon atoms.

According to some embodiments of the present invention, the fullerene derivative can be represented by general Formula I:

$C_nR_m$ Formula I whereas n and m are integers representing the ratio of the number of carbon atoms to the number of R substituents in the fullerene; and R is an electron-withdrawing substituent of the fullerene or a moiety having electron-withdrawing groups, as detailed herein; and the fullerene is a spherical fullerene, a tubular fullerene, a linear fullerene or a planar fullerene.

The phrases "electron-withdrawing substituent" or "electron-withdrawing group" are well known to those of skill in the art and are used herein interchangeably as their standard meaning which is a functional group that draws electrons to itself more than a hydrogen atom would if it occupied the same position in the molecule, as described in J. March, Advanced Organic Chemistry, third edition, Pub: John Wiley & Sons, Inc. (1985).

Exemplary electron-withdrawing substituents include, but are not limited to, halogen, pseudohalogen, haloalkyl, haloalicyclic, haloaryl, haloheteroaryl, carbonyl, ester, —C(═O)H and any combination thereof.

According to some embodiments, the electron-withdrawing substituent/group is halogen (directly attached to the fullerene core) or rich with halo substituents (e.g., haloalkyl, haloalicyclic, haloaryl, halyheteroaryl and the likes), and hence the fullerene derivative is referred to herein as a halogenated fullerene.

The term "halogenated", as used herein with respect to fullerene, describes a compound which includes at least one covalently-attached halogen atom in its structure.

A "halogenated fullerene", as used herein, encompasses fullerene having halogen-containing substituents only, or, optionally, fullerene having in addition other, non-halogen containing substituents.

In one embodiment, the halogenated fullerene includes halogen-containing substituents only.

As used herein, the terms "halo", "halogen" and "halide", which are referred to herein interchangeably, describe an atom of a halogen, that is fluorine, chlorine, bromine or iodine, also referred to herein as fluoro or fluoride, chloro or chloride, bromo or bromide and iodo or iodide.

As the number of halo atoms attached to any fullerene can vary controllably, it is stated that fluorinated fullerenes constitute a tunable family of dopants in organic electronics according to embodiments of the present invention.

The terms "haloalkyl", "halogenoalkane" or "alkyl halide", which are referred to herein interchangeably, describe an alkyl group as defined herein, further substituted by one or more halide(s). Non-limiting examples of haloalkyls include halomethyls ($—CH_iX_j$ wherein i and j are integers ranging from 0 to 3 whereas i+j=3, and X denotes any halide), haloethyls ($—CH_{i1}X_{j1}CH_{i2}X_{j2}$ wherein i1, i2, j1 and j2 are integers whereas i1+j1=2, i2+j2=3 or i1+j1+i2+j2=5 and X denotes any halide)

Exemplary haloalkyls include, without limitations, halomethyls such as chloromethyl ($—CH_2Cl$), dichloromethyl ($—CHCl_2$), trifluoromethyl ($—CF_3$), trichloromethyl ($—CCl_3$), chlorofluoromethyl (—CHClF), dichlorofluoromethyl ($—CCl_2F$) and chlorodifluoromethyl ($—CClF_2$); haloethyls such as 1,1,1-Trichloroethyl ($—CH_2CCl_3$), pentachloroethyl ($—C_2F_5$) and 1,1-dichloro-2,2,2-trifluoroethyl ($—CCl_2—CF_3$); and longer haloalkanes and polymers such as 1,1,2,2,3,3,3-heptafluoropropane ($—(CF_2)_2CF_3$), decafluorobutane ($—CF_2—CF_2—CF_2—CF_3$) and poly(1,1-difluororoethene) ($—[CF_2—CH_2]_n—$).

The term "pseudohalogen" as used herein, refers to binary compounds such cyanide, cyanate, thiocyanate, and the likes, which exhibit similar activity and high degree of electronegativity as halogens.

As used herein, the term "alkyl" describes an aliphatic hydrocarbon including straight chain and branched chain groups. Preferably, the alkyl group has 1 to 20 carbon atoms, and more preferably 1-10 carbon atoms. Whenever a numerical range; e.g., "1-10", is stated herein, it implies that the group, in this case the alkyl group, may contain 1 carbon atom, 2 carbon atoms, 3 carbon atoms, etc., up to and including 10 carbon atoms. The alkyl can be substituted or unsubstituted. When substituted, the substituent can be, for example, an alkyl, an alkenyl, an alkynyl, a cycloalkyl, an aryl, a heteroaryl, a halide, a hydroxyl and an alkoxy, as these terms are defined herein. The term "alkyl", as used herein, also encompasses saturated or unsaturated hydrocarbon, hence this term further encompasses alkenyl and alkynyl.

The term "alkenyl" describes an unsaturated alkyl, as defined herein, having at least two carbon atoms and at least one carbon-carbon double bond. The alkenyl may be substituted or unsubstituted by one or more substituents, as described hereinabove.

The term "alkynyl", as defined herein, is an unsaturated alkyl having at least two carbon atoms and at least one carbon-carbon triple bond. The alkynyl may be substituted or unsubstituted by one or more substituents, as described hereinabove.

The term "hydroxy", as used herein, refers to an —OH group.

The term "alkoxy" refers to a —OR' group, were R' is alkyl, aryl, heteroalicyclic or heteroaryl.

The integers n and m in the formula hereinabove are such that n is typically greater than m, with an n to m ratio that can range, for example, from 1:1 to 1:0.01, or otherwise represented as 1:1 to 100:1. In some embodiments, the n to m ratio ranges from 1:1 to 20:1. It is noted that since the n to m ratio affects the semiconductive properties of the dopant and its electron acceptor properties, this ratio can be pre-determined so as to suit the selected organic semiconductor material.

The term "amide", as used herein, refers to a —C(═O)NR'R", were R' is as defined herein, and R" is as defined for R'.

The term "cyano", as used herein, refers to a —CN group.

The term "carbonyl", as used herein, refers to a —C(═O)R' group, as in for example a ketone, where R is as defined herein.

The term "ester" refers to a —C(═O)—OR group, where R is as defined herein.

The term "aldehyde" refers to a —C(═O)H group.

It is further noted that the n to m ratio represents an average ratio of the distribution of the "R" substituents within the fullerene molecules.

According to some embodiments of the present invention, exemplary halogenated fullerene derivatives which are represented by general Formula I include, without limitations, $C_{60}F_4$, $C_{60}F_6$, $C_{60}F_8$, $C_{60}F_{18}$, $C_{60}F_{20}$, $C_{60}F_{36}$, $C_{60}F_{48}$, $C_{60}(CF_3)_{18}$, $C_{60}(CF_3)_{36}$, $C_{60}(CF_3)_{48}$, $C_{60}F_7CF_3$, $C_{60}F_8O$, $C_{60}F_6O$ $C_{60}F_4O$, $C_{60}F_2O$ and $C_{70}F_{54}$.

It is stated herein that the examples of halogenated fullerene derivatives encompass compounds which are halogenated also by chlorine, bromine and iodine and combinations thereof, and encompass fullerenes of various shapes and sized as well as mixtures thereof.

According to some embodiments of the present invention, the halogenated fullerene derivative is $C_{60}F_{36}$.

The elevation of the charge carrier density and the effective charge carrier mobility is therefore achieved, according to the present embodiments, by doping the OSC with a halogenated fullerene derivative which is selected so as to have a LUMO at a level which is sufficient to allow electron transfer from a HOMO of said organic semiconductor material to said LUMO.

In the context of the present embodiments, the phrase "sufficient to allow electron transfer" refers to a sufficient proximity in terms of energy level difference of the LUMO of the dopant with respect to the HOMO of the semiconductor material. That is to say that the LUMO of the dopant may be higher (or lower) than the HOMO of the semiconductor material, but sufficiently close so as to provide a conduit for charge transfer. Alternatively, the LUMO of the dopant can be the same as the HOMO of the organic semiconductor material.

According to some embodiment of the present invention, the energy level of the LUMO of the fluorinated fullerene derivative is less than about 2 eV above the energy level of the HOMO of the OSC. In some embodiments, the energy level of the LUMO of the fluorinated fullerene derivative is less than about 1 eV above the energy level of the HOMO of the OSC. In some embodiments, the energy level of the LUMO of the fluorinated fullerene derivative is less than about 0.4 eV above the energy level of the HOMO of the OSC.

Table 1 presents the structure and LUMO values of some exemplary fluorinated $C_{60}$ molecules.

TABLE 1

| Structure | LUMO (eV) |
|---|---|
| 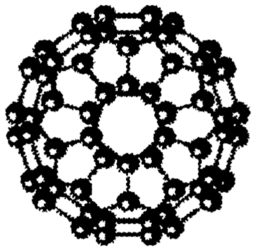 $C_{60}F_0$ | −3.6 |

TABLE 1-continued

| Structure | LUMO (eV) |
|---|---|
| 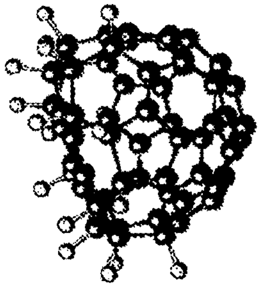 $C_{60}F_{18}$ | 4.1 |
| 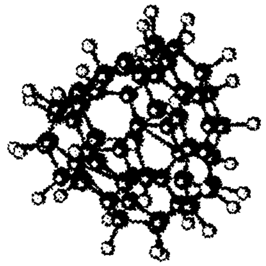 $C_{60}F_{36}$ | −4.4 |
| 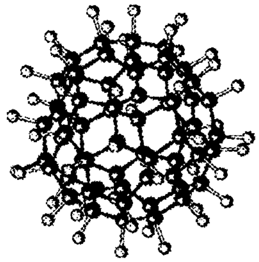 $C_{60}F_{48}$ | −4.7 |
| $C_{70}F_{54}$ | −4.95 |

In some embodiments, an energy level of the LUMO of the halogenated fullerene is lower than an energy level of a LUMO of a non-halogenated fullerene by at least 0.5 eV. Thus, the energy level of the LUMO of the halogenated fullerene can be lower than an energy level of a LUMO of a non-halogenated fullerene by, for example, 0.5 eV, 0.6 eV, 0.7 eV, 0.8 eV, 0.9 eV, 1.0 eV and even by 2.0 eV or more.

By "non-halogenated fullerene" it is meant a bear fullerene, having no substituents, or a fullerene having one or more substituents other than the halo-containing substituents listed hereinabove.

In general, the haloganted fullerene derivatives described herein can be substituted, in addition to the halo-containing substituents, by substituents such as, for example, other electron-withdrawing substituents/groups as described hereinabove, substituted or unsubstituted alkyl, oxygen-containing groups (e.g., hydroxyl, carboxyl, alkoxy, aldehyde, epoxide, peroxide and the likes), sulfur-containing groups (e.g., thiol, thioalkoxy, sulfate, sulfide, sulfoxide, sulfone and the likes), nitrogen-containing groups (e.g., amine, amide, diazo, azide and the likes) and pseudohalogens (e.g., cyanate, thiocyanate, rhodanide, azide, cyanide and the likes).

In one embodiment, the organic semiconductor material is poly(3-hexylthiophene-2,5-diyl) and the fullerene halogenated derivative is $C_{60}F_{36}$.

In some embodiments, the organic semiconductor material is triarylamine and the fullerene halogenated derivative is $C_{60}F_{36}$.

In some embodiments, the organic semiconductor material is polyvinylcarbazole-cinnamate (PVK-Cin) and the fullerene halogenated derivative is $C_{60}F_{36}$.

In some embodiments, the organic semiconductor material is poly[-bis(4-butylphenyl)-bis(phenyl)benzidine] (poly-TPD) and the fullerene halogenated derivative is $C_{60}F_{36}$.

Other examples of pairs of organic semiconductor materials and halogenated fullerene derivatives which are suitable for use in the context of the present embodiments due to their respective HOMO and LUMO include, without limitation N,N'-diphenyl-bis(3-methylphenyl)-(1,1'-biphenyl)-4,4'-diamine (TPD) or poly-TPD and $C_{60}F_{36}$, poly(p-phenelyne vinylene) (PPV) and $C_{60}F_{36}$, TDATA and $C_{60}F_{36}$, copper(ii) phthalocyanine (CuPc) and $C_{60}F_{36}$, Poly(3-hexylthiophene-2,5-diyl) and $C_{60}F_{48}$, TPD or poly-TPD and $C_{60}F_{48}$, PPV and $C_{60}F_{48}$, TDATA and $C_{60}F_{48}$, copper(ii) phthalocyanine (CuPc) and $C_{60}F_{48}$, PVK and $C_{60}F_{48}$, poly(9,9-dioctylfluoreny-2,7-diyl) (PFO) and $C_{60}F_{48}$, poly (9,9-dioctylfluorene-co-benzothiadiazole) (PFOBT) and $C_{60}F_{48}$, Alq3 and $C_{60}F_{48}$, and N,N'-diphenyl-N,N'-bis(1-naphthyl)-1,1'-biphenyl-4,4'-diamine (α-NPD) and $C_{60}F_{48}$.

The method provided herein can be utilized as a part of a process for manufacturing electronic, photoelectronic and other devices which are based on semiconductors in general, and on p-doped OSC in particular, as these are discussed hereinbelow.

The doping process is effected by two general approaches, the solution-processed preparations and vapor-phase processes. These approaches can be combined to achieve the desired physico-electronic properties according to the application of interest.

The p-doped OSCs according to the present embodiments are particularly advantageous since they allow production processes in solution. Thus, films, including layers and coatings, may be generated by low cost production techniques, for example, spin-coating and printing. In essence, the organic material which is used as the OSC matrix can be dissolved, and even polymerized in-situ in a solvent, and so can the halogenated fullerene derivative be dissolved in a suitable solvent which is miscible in the solvent of the OSC, or optionally be the same. These two solutions can then be mixed together in any desired and effective ratio to afford a doped OSC, according to the present embodiments. Such a solution-based process is described in general and by way of an exemplary working electronic device prepared by such solution-based process and presented herein.

Suitable solvents or solvent mixtures comprise alkanes and/or aromatics, and halogenated derivatives thereof.

The method for applying the solution-processed p-doped OSC of the present embodiments can be any method of applying a liquid so as to arrive at a uniform thin layer, such as spin-coating, printing, dipping and the likes.

Alternative methods of deposition for the polymer/copolymer material(s) include spin-coating, blade-coating, meniscus-coating, dip-coating, self-assembly, vacuum sublimation (particularly for producing layers of small molecule materials), ink-jet printing, etc. The polymer material(s), according to some embodiments, are solution-processable.

The term “spin-coating”, as used herein, describes a procedure used to apply uniform thin films to flat substrates, which is effected by placing an excess amount of a solution on the substrate and rotating the substrate at high speed in order to spread the fluid by centrifugal force. The desired thickness of the film is achieved by manipulating the time of rotation and the speed. If a volatile solvent is used, it evaporates simultaneously. Hence, the thickness is determined by the viscosity and volatility of the solvent, the angular speed of spinning and the concentration of the solute.

Printing is another suitable technique of applying the p-doped OSC of the present embodiments, which allows intricate and complex pattens to be applied onto the substrate, thus achieving a myriad of shapes and combinations thereof in terms of composition, morphology, thickness and activity.

Since the p-doped OSCs of the present invention can be prepared in solution, the solvent and the overall concentration can be selected so as to suit the printing technique in terms of the viscosity, flowability and other characteristics, and also can include other components which are needed in order to achieve the desired results. Printed electronic devices and processes of affording the same are well known in the art.

Another process which can be used to dope an OSC with a halogenated fullerene derivative, which is also another process for obtaining a thin and uniform layer of the doped OSC, is vapor deposition, of evaporation-based techniques.

Vapor deposition is a general term used to describe any of a variety of methods for depositing a thin film of a material by the condensation, reaction or conversion of a vaporized form of the material, or a precursor thereof, onto the surface of various substrates. Thin films are thin material layers ranging from fractions of a nanometer to several micrometers in thickness. Vapor deposition is used to form a coat (film) of the deposited material so as to alter the electrical (such as semiconductivity), electrochemical (such as electrode efficiency), thermal (such as heat conductivity), optical (such as light reflectivity) and chemical (such as corrosion resistance, chemical compatibility, wettability and hydrophobicity) of the substrates.

Vapor deposition processes typically belong to one of two categories of vapor deposition processes: physical vapor deposition (PVD) and/or chemical vapor deposition (CVD), both of which are usually performed in a vacuum chamber.

In PVD, the coating method involves mainly physical processes such as, for example, elevated temperatures, high vacuum or plasma sputter bombardment, rather than a chemical reaction of a vaporized material at the surface to be coated, as in chemical vapor deposition (CVD). Evaporative deposition is a PVD process in which the material to be deposited is heated to a high vapor pressure by electrically resistive heating in “high” vacuum. Electron beam deposition is a PVD process in which the material to be deposited is heated to a high vapor pressure by electron bombardment in “high” vacuum. Sputter deposition is a PVD process in which a glow plasma discharge (usually localized around the “target” by a magnet) bombards the material sputtering some of it away as a vapor. Cathodic arc deposition is a PVD process in which a high power arc is directed at a material blasts some of it away into a vapor. Pulsed laser deposition is a PVD process in which a high power laser ablates material into a vapor.

PVD methods produce even and homogeneous coating of entire objects in a relatively straight-forward procedure, however, the physical conditions to which the subject and the coating material are subjected-to are rather harsh, and therefore may harm some heat sensitive target materials.

According some embodiments, the OSC material and the halogenated fullerene derivative can be co-vaporized from two separate sources while controlling the relative ratio of these components by controlling their source size, temperature, concentration and/or amount, the distance of each source from the target substrate, partial screening of the target from one or both sources and other techniques known in the art.

Alternatively, the OSC material and the halogenated fullerene derivative can be mixed together at a desired ratio and then be subjected to a vapor deposition process.

Another alternative is depositing the dopant on a pre-existing layer of the OSC such that a thin top layer of a p-doped OSC is afforded.

These processes are described in the Examples section that follows below.

In each of the methods, processes or devices presented herein, the electronic doping of the OSC is effected directly by the ratio of the organic semiconductor material to the halogenated fullerene derivative.

Depending on the intrinsic electrochemical characteristics of the OSC material and the halogenated fullerene derivative (HFD), namely the relative difference of their HOMO and LUMO, respectively, and the application for which the composition containing the same is used, the relative ratio of the two components in the composition can range from about 20% OSC to about 80% HFD to about 99.99% OSC to about 0.01% HFD.

In some embodiments, the relative amount of the halogenated fullerene derivative is lower than 50 percents, lower than 20 percents, and even as low as 0.01 percents by weight, relative to the weight percents of the OSC.

According to embodiments of the present invention, the ratio of OSC to the halogenated fullerene derivative p-dopant ranges from about 80 to 20 percent by weight to about 99.99 to 0.01 percent by weight respectively.

In some embodiments, the ratio of the organic semiconductor material to the halogenated fullerene derivative is 90/10, 99/1, 99.9/0.1 or 99.99/0.01 percent by weight respectively.

The p-doped OSCs according to the present embodiments can additionally comprise one or more other suitable components such as, for example, solvents, catalysts, sensitizers, stabilizers, inhibitors, chain-transfer agents, co-reacting monomers, surface-active compounds, lubricating agents, wetting agents, dispersing agents, hydrophobing agents, adhesive agents, flow improvers, defoaming agents, deaeration agents, diluents, reactive diluents, auxiliaries, colorants, dyes or pigments.

The p-doped OSCs according to the present embodiments can also be co-polymerized with polymerizable mesogenic compounds to induce or enhance liquid crystal phase behaviour. Polymerizable mesogenic compounds that are suitable as comonomers are known in the art and disclosed, for example, in WO 93/22397; EP 0,261,712; DE 195,04,224; WO 95/22586 and WO 97/00600, which are incorporated by reference as if fully set forth herein.

The p-doped OSCs according to the present embodiments can comprise a liquid crystal side chain polymer (SCLCP) obtained from a polymerizable liquid crystal material by polymerization or polymer analoguous reaction, as known in the art. Side chain liquid crystal polymers or copolymers (SCLCPs), in which the semiconductor component is located as a pendant group, separated from a flexible backbone by an aliphatic spacer group, offer the possibility to obtain a highly ordered lamellar like morphology. This structure consists of closely packed conjugated aromatic mesogens, in which very close (typically less than 4 Å) $\pi$-$\pi$ stacking can occur. This stacking allows intermolecular charge transport to occur more easily, leading to high charge carrier mobilities, and are therefore sensitive to p-doping, as presented herein. SCLCPs are advantageous for specific applications as they can be readily synthesized before processing and then, for example, be processed from solution in an organic solvent with the halogenated fullerene derivative p-dopant, according to the present embodiments. If SCLCPs are used in solutions, they can orient spontaneously when coated onto an appropriate surface and when at their mesophase temperature, which can result in large area, highly ordered domains. SCLCPs can be prepared from the polymerisable compounds or mixtures by conventional polymerisation techniques which are known to those skilled in the art, including for example radicalic, anionic or cationic chain polymerisation, polyaddition or polycondensation.

The p-doped OSCs according to the present embodiments are useful as optical, electronic and generally for any application where organic semiconductor materials are useful.

In some embodiments, the p-doped OSCs according to the present embodiments are used as charge transport materials in field effect transistors (FETs), for example, as components of integrated circuitry, ID tags or thin film transistors (TFTs) applications. Alternatively, the p-doped OSCs may be used in organic light emitting diodes (OLEDs) in electroluminescent display applications or as backlight of, for example, liquid crystal displays, as photovoltaics or sensor materials, for electrophotographic recording, and for other semiconductor applications.

Typically, FETs are electronic devices where an organic semiconductive material is arranged as a film between a gate-dielectric and a drain and a source electrode, and are generally known and taught, for example, in U.S. Pat. No. 5,892,244, WO 00/79617, U.S. Pat. No. 5,998,804, and from the references cited in the Background section hereinabove. Due to the advantages, like low cost solution-based production of the p-doped OSCs according to the present embodiments and thus the processibility of large surfaces, preferred applications of these FETs are such as integrated circuitry, TFT-displays and security applications.

An organic field effect transistor (OFET) device according to the present embodiments comprises a source electrode, a drain electrode, a gate electrode, a semiconductor layer p-doped with a halogenated fullerene derivative, one or more gate insulator layers and optionally a substrate. Suitable structures and manufacturing methods of an OFET device are known to the skilled in the art and are described in the literature, for example, in WO 03/052841.

Due to the capacity to be applied in solution, and thus be applied by general printing techniques known in the art, the p-doped OSCs according to the present embodiments are particularly useful in security applications. Field effect transistors and other devices comprising the p-doped OSCs according to the present embodiments, like transistors or diodes, may be used for ID tags or security markings to authenticate and prevent counterfeiting of documents of value like banknotes, credit cards or ID cards, national ID documents, licenses or any product with monetary value, like stamps, tickets, shares, cheques and the likes.

Due to their flexibility and solution-born processes of fabrication, the p-doped to OSCs according to the present embodiments may be used in organic light emitting devices or diodes (OLEDs), for example, in display applications or as backlight of, for example, liquid crystal displays. Common OLEDs are realized using multilayer structures. An emission layer is generally sandwiched between one or more electron-transport and/or hole-transport layers. By applying an electric voltage electrons and holes as charge carriers move towards the emission layer where their recombination leads to the excitation and hence luminescence of the lumophor units contained in the emission layer. The p-doped OSCs according to the present embodiments may be employed in one or more of the charge transport layers and/or in the emission layer, corresponding to their electrical and/or optical properties. The selection, characterization as well as the processing of suitable OSC materials for the use in OLEDs is generally known by skilled artisan, and are taught, for example, in Meerholz, *Synthetic Materials,* 111-112, 2000, 31-34, Alcala, *J. Appl. Phys.,* 88, 2000, 7124-7128 and the literature cited herein.

According to another use, the p-doped OSCs according to the present embodiments, especially those which show photoluminescent properties, may be employed as materials of light sources, for example, of display devices such as described in EP 0889350 or by C. Weder et al., *Science,* 279, 1998, 835-837.

According to another use, the p-doped OSCs according to the present embodiments can be used alone or together with other materials in or as alignment layers in LCD or OLED devices, as described for example in U.S. Patent Application No. 20030021913. The use of p-doped OSCs according to the present embodiments can increase the electrical conductivity of the alignment layer. When used in an LCD, this increased electrical conductivity can reduce adverse residual DC effects in the switchable LCD cell and suppress image sticking or, for example in ferroelectric LCDs, reduce the residual charge produced by the switching of the spontaneous polarization charge of the ferroelectric LCs. When used in an OLED device comprising a light emitting material provided onto the alignment layer, this increased electrical conductivity can enhance the electroluminescence of the light emitting material. The p-doped OSCs according to the present embodiments having mesogenic or liquid crystalline properties can form oriented anisotropic films as described above, which are especially useful as alignment layers to induce or enhance alignment in a liquid crystal medium provided onto said anisotropic film. The p-doped OSCs according to the present embodiments may also be combined with photoisomerisable compounds and/or chromophores for use in or as photoalignment layers, as described in U.S. Patent Application No. 20030021913.

The p-doped OSCs according to the present embodiments, especially their water-soluble formulations (for example with polar or ionic side groups), can be employed as chemical sensors or materials for detecting and discriminating various analytes, such as chemical analytes, biologic analytes and the likes. For example, the detector/sensor, based on the p-doped OSCs according to the present embodiments, can be used to detect and identify DNA in general, and DNA of particular sequences. Such uses are described for example in L. Chen, D. W. McB ranch, H. Wang, R. Helgeson, F. Wudl and D. G. Whitten, Proc. Natl. Acad. Sci. U.S.A. 1999, 96, 12287; D. Wang, X. Gong, P. S. Heeger, F. Rininsland, G. C. Bazan and A. J. Heeger, Proc. Natl. Acad. Sci. U.S.A. 2002, 99, 49; N. DiCesare, M. R. Pinot, K. S. Schanze and J. R. Lakowicz, Langmuir 2002, 18, 7785; D. T. McQuade, A. E. Pullen, T. M. Swager, Chem. Rev. 2000, 100, 2537.

It is expected that during the life of a patent maturing from this application many relevant p-doped organic semiconductors having a halogenated fullerene derivative dopant will be developed and the scope of the phrase "halogenated fullerene derivative dopant for p-doping an organic semiconductor material" is intended to include all such new technologies a priori.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions, illustrate some embodiments of the invention in a non limiting fashion.

Materials and Methods

Poly(3-hexylthiophene-2,5-diyl) (P3HT, CAS N. 104934-50-1) was purchased from Rieke Metals Inc, USA.

[6,6]-phenyl-$C_{61}$-butyric acid methyl ester or phenyl-$C_{61}$-butyric acid methyl ester (PCBM, 99.5%) was purchased from NANO-C, Inc.

$C_{60}$ (for $C_{60}F_{36}$ preparation, 99.5%), was purchased from TermUSA.

$C_{60}$ (for reference, 99.9%), was purchased from Sigma-Aldrich.

All commercial reagents and materials were used without further purification.

$C_{60}F_{36}$ was synthesized from $C_{60}$ and $MnF_3$ (Fluorochem Ltd., 99%) according to a published procedure [9].

The active layer of the electronic devices of the diode and thin film transistor type, used in the experiments, contained a mixture of regio-regular P3HT, purchased from Rieke Metals, and fluorinated fullerene $C_{60}F_{36}$.

Example 1

Potentiodynamic Electrochemical Measurements of Doped Systems

To characterize the ability and capacity for doping of $C_{60}F_{36}$, its HOMO-LUMO gap was measured and compared to other $C_{60}$ derivatives.

The OSC polymer, poly(3-hexylthiophene-2,5-diyl) (P3HT, CAS N. 104934-50-1) was selected as an exemplary OSC polymer to show the doping effect of the $C_{60}$ and an exemplary fullerene derivative [6,6]-phenyl-$C_{61}$-butyric acid methyl ester (PCBM), which is commonly used in the art as an excited state acceptor.

Cyclic voltammetry (CV) was used for the potentiodynamic electrochemical measurements of the electrochemical properties of the analytes in the form of thin films.

Generally, the polymer films were fabricated by spin-coating a blend of P3HT/fullerene in 90/10, 99/1, 99.9/0.1, 99.99/0.01 and 100/0 weight percent ratios respectively. P3HT was first dissolved in 1,2-dichlorobenzene (DCB) to afford a 20 mg/ml solution, followed by blending with 20 mg/ml solution of $C_{60}F_{36}$ or $C_{60}$/PCBM in DCB. The blend was stirred for about 7 hours at 45° C. in an inert atmosphere glove box. The active layer was obtained by spin-coating the blend at 1500 rpm for 80 seconds. The samples were dried by heat of 110° C. for 180 minutes in an inert atmosphere glove box. The thickness of film was estimated at about 70 nm, as measured by $\alpha$-step.

The samples for the CV measurements were prepared as films on indium tin oxide (ITO) substrates as a working electrode by spin coating at 4000 rpm for P3HT and at 1500 rpm for other materials from $C_6H_4Cl_2$ (dichlorobenzene, DCB) solutions. The samples were examined in the cell containing of 0.1 M tetrabutylammonium hexafluorophosphate ($Bu_4NPF_6$) in anhydrous acetonitrile ($CH_3CN$) as supporting electrolyte. A platinum wire was used as a counter electrode and $Ag/AgNO_3$ (0.01 M in $CH_3CN$) as a reference electrode, respectively. The scan speed was equal to 0.1 volts per second (V/s).

All preparations and measurements were carried out in inert atmosphere glove box on a CV analyzer AUTOLAB, PGSTAT12 (Eco Chemie B.V., The Netherlands).

The onset potential was used to determine the HOMO energy level below the vacuum, all measurements were calibrated using ferrocene (Fc) as a standard [11], and the results in terms of the HOMO/LUMO of the studied systems are presented in FIGS. 1A-B.

Figure 1B:
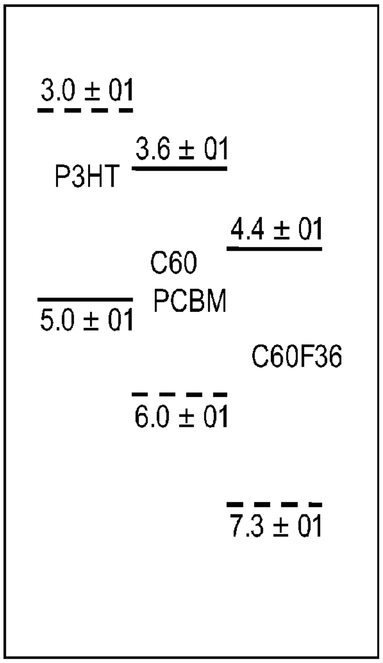

FIGS. 1A-B present cyclic voltammograms of [6,6]-phenyl-$C_{61}$-butyric acid methyl ester (PCBM, dashed line in FIG. 1A), $C_{60}F_{36}$ (solid line in FIG. 1A), showing the onset of the reduction wave, or the LUMO level (marked by an arrow in FIG. 1A for the two compounds), and the cyclic voltammograms of poly(3-hexylthiophene-2,5-diyl) (P3HT, insert in FIG. 1A), and the HOMO and LUMO levels (solid line in FIG. 1B) of the isolated compounds $C_{60}$, PCBM, $C_{60}F_{36}$ and P3HT.

As can be seen in FIGS. 1A-B, the relative position of the P3HT LUMO and those of the fullerenes define the fullerene molecules as good excited-state electron acceptor molecules. However, in the ground state, the available state for electrons (LUMO) in $C_{60}$ and/or PCBM is more than 1 eV (about 1.4 eV) above the occupied P3HT HOMO, thus making an electron transfer event highly unlikely. Namely, adding $C_{60}$ and/or PCBM to an OSC such as P3HT would not constitute an effective electronic doping process. On the other hand, the LUMO of $C_{60}F_{36}$ is only 0.6 eV above the HOMO of P3HT thus making the ground-state electron transfer event, even at room temperature, more likely and hence adding $C_{60}F_{36}$ to P3HT constitutes a p-type doping, or a p-doping process of an OSC, thereby rendering the p-doped OSC polymer more suitable for many electronic applications.

Example 2

Charge-polaron Induced Absorption in Doped Systems

A known signature of charge transfer in OSC conjugated polymers is the appearance of a new absorption band associated with charge-polaron induced absorption. Polarons are quasiparticles composed of an electron and a polarization field associated therewith. Polarons are formed when a charge within a molecular chain influences the local nuclear geometry, causing an attenuation or even reversal of nearby bond alternation amplitudes, constituting an excited state which possesses an energy level between the lower and upper energy level bands.

In order to measure the effect of doping of an OSC polymer with a fluorinated fullerene derivative according to embodiments of the present invention, the absorption spectrum of various systems was recorded and compared as follows.

Polymer films (and blends of OSC and fullerenes) were prepared as described in Example 1 hereinabove. Absorption spectra were measured using UV-Vis-IR spectrophotometer (Shimadzu Scientific Instruments).

Figure 2A:
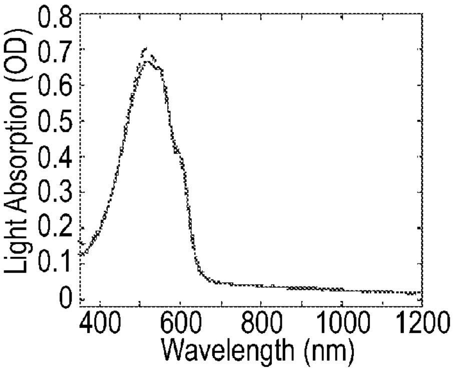
FIGS. 2A-B are light absorption spectra obtained for P3HT mixed with 10% by weight of $C_{60}$ (dashed line in FIG. 2A), normalized by curve overlapping of the right-hand slope to the spectrum obtained for pristine P3HT (solid line in FIG. 2A), and the absorption spectrum of P3HT doped with 10% by weight of an exemplary derivatized fullerene $C_{60}F_{36}$ (dashed line in FIG. 2B), normalized by curve overlapping of the right-hand slope to the spectrum obtained for pristine P3HT (solid line in FIG. 2B), showing the difference between the two absorption spectra (ΔOD curve in the insert of FIG. 2B), which is indicative of a charge-polaron induced absorption attributed to the shift in the oscillator strength to longer wavelengths as expected in the case of charge transfer events induced by doping.
Figure 2B:
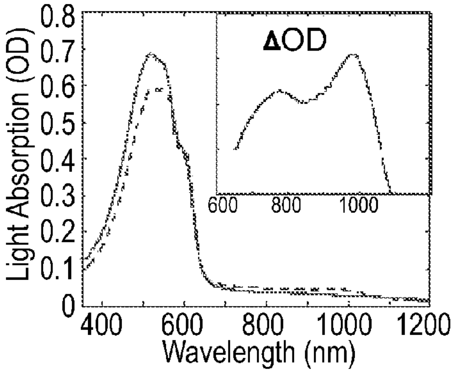

The results in terms of optical densities and color observed in the studied systems are presented in FIGS. 2A-B.

FIGS. 2A-B are light absorption spectra obtained for P3HT mixed with 10% by weight of $C_{60}$ (dashed line in FIG. 2A), normalized by curve overlapping of the right-hand slope to the spectrum obtained for pristine (undoped) P3HT (solid line in FIG. 2A), and the absorption spectrum of P3HT doped with 10% by weight of $C_{60}F_{36}$ (dashed line in FIG. 2B), normalized by curve overlapping of the right-hand slope to the spectrum obtained for pristine P3HT (solid line in FIG. 2B), showing the difference between the two absorption spectra (ΔOD curve in the insert of FIG. 2B), which is indicative of a charge-polaron induced absorption attributed to the shift in the oscillator strength to longer wavelengths as expected in the case of charge transfer events induced by doping.

This method of extracting the induced absorption shift caused by doping is similar to other experiments using charge modulation spectroscopy (CMS) of P3HT in an inorganic system of a metal-insulator-semiconductor (MIS) diode device structure [12]. These findings strongly support the working assumption that the observed effect is a direct result of a charge transfer or p-doping.

Example 3

Visual Effects in Doped Systems

In order to demonstrate the visual effect of p-doping by fluorinated fullerene derivatives according to embodiments of the present invention, two sets of solutions containing an OSC polymer (P3HT) mixed with a non-fluorinated fullerene ($C_{60}$) and a fluorinated fullerene ($C_{60}F_{36}$) in dichlorobenzene (DCB) were compared by visual inspection, and the results are presented in FIGS. 3A-B.

FIGS. 3A-B are color photographs of two sets of vials, wherein vial No. 1 contains $C_{60}$ (20 mg in 1 ml of DCB); vial No. 2 contains P3HT (20 mg in 1 ml of DCB); vial No. 3 contains P3HT (20 mg in 1 ml of DCB) mixed with $C_{60}$ (2 mg or 10% by weight); vial No. 4 contains P3HT (20 mg in 1 ml of DCB) mixed with $C_{60}$ (0.2 mg or 1% by weight); vial No. 5 contains P3HT (20 mg in 1 ml of DCB) mixed with $C_{60}$ (0.002 mg or 0.01% by weight); vial No. 6 contains $C_{60}F_{36}$ (20 mg in 1 ml of DCB); vial No. 7 contains P3HT (20 mg in 1 ml of DCB); vial No. 8 contains P3HT (20 mg in 1 ml of DCB) doped with $C_{60}F_{36}$ (2 mg or 10% by weight); vial No. 9 contains P3HT (20 mg in 1 ml of DCB) doped with $C_{60}F_{36}$ (0.2 mg or 1% by weight); and vial No. 10 contains P3HT (20 mg in 1 ml of DCB) doped with $C_{60}F_{36}$ (0.002 mg or 0.01% by weight).

As can be seen in FIGS. 3A-B, the effect of doping-induced enhanced absorption of visible light can be seen clearly, as expressed by the black color of the solution in the vials containing 10% and 1% $C_{60}F_{36}$ (vials Nos. 8 and 9) and the absence of this phenomena in the vials containing $C_{60}$ (vials Nos. 3 and 4).

Example 4

Photoluminescence Quenching in Doped Systems

To demonstrate the interaction between an OSC and a fluorinated fullerene-based dopant, the photoluminescence (PL) quenching of an OSC (for example P3HT) upon the addition of fullerene-based molecules (for example exemplary $C_{60}$ or $C_{60}F_{36}$) was measured in various concentrations.

The PL spectral measurements and PL quantum efficiency measurements were performed on an integrated system based on the FS920 fluorimeter by Edinburgh Instruments Ltd. (U.K.). The PL quantum efficiency measurements were carried out using IS-040-SL Integrating sphere (Labsphere) that was fiber coupled to the FS920, following a published procedure [13], and the normalized PL quantum efficiency (PLQE) curves are presented in FIGS. 4A-B.

FIG. 4 presents comparative plots, showing the photoluminescence quantum efficiency (PLQE) as a function of the amount of guest molecule expressed in weight percents as measured for $C_{60}$ (dashed line and round symbols) and for $C_{60}F_{36}$ (solid line and square symbols) in P3HT (the PLQE of the pristine P3HT was 6%, data not shown).

As can be seen in FIG. 4, $C_{60}F_{36}$ quenches the luminescence much faster as compared to the effect of $C_{60}$, and that significant quenching is observed already at 0.1 weight percent of $C_{60}F_{36}$ in P3HT. The longer range and more significant quenching suggest an interaction between the two species, likely being via a mechanism of charge transfer from the P3HT to $C_{60}F_{36}$ (namely p-doping). As can be seen in FIG. 1B, the LUMO level of $C_{60}F_{36}$ is expected to be close enough to the HOMO level of P3HT, thus making the charge transfer an energetically viable process at room temperature.

Example 5

Voltage and Current Characteristics of Doped OSC-based Devices

In order to explore the properties and use of $C_{60}F_{36}$ as an electronic dopant of OSC in devices, various electronic device structures, namely a diode and a thin film transistor (TFT) containing a $C_{60}F_{36}$-doped OSC were prepared.

Diodes were prepared on glass/ITO substrates with the ITO serving as bottom contact. A first, conditioning, PEDOT layer was spin-coated to a thickness of about 100 nm and annealed at100° C. for 3 hours. Thereafter a P3HT based active layer was applied by spin-coating and annealed at 110° C. for 3 hours. The device was completed by forming silver contact by evaporation. The I-V characteristics were measured using a semiconductor parameter analyzer (Agilent Technologies).

FIG. 5 presents comparative Current-Voltage (I-V) plots characteristic of P3HT (solid line) and doped P3HT (dashed line) as measured in an OSC-based diode device.

As can be seen in FIG. 5, there is a typical turn on voltage observed for the pristine P3HT that is dictated by the work function difference between the two contacts (PEDOT and Ag) which is approximately 1 eV. As can further be seen in FIG. 5, the device exhibited an almost complete short-circuit characteristics in the P3HT device doped with 10 weight percents of $C_{60}F_{36}$, up to the equipment's compliance current (4 mA).

The TFT device construction and measurements procedures were performed according to a published procedure [14]. Briefly, the structure of the TFT was of a typical bottom contact organic TFT where doped silicon covered with thermal oxide served as the gate and gate dielectric, respectively. Gold source and drain electrodes were lithographically patterned on the oxide and the device was completed by spin coating the organic film.

FIGS. 6A-B present the output characteristics used at gate voltages of $V_{GS}$=0 and $V_{GS}$=−20V of three TFT devices which are based on pristine P3HT (dotted line and triangle symbols in FIG. 6A), the same mixed with 0.1 weight percent of $C_{60}$ (dashed line and square symbols in FIG. 6A) and the same doped with 0.1 weight percent of $C_{60}F_{36}$ (full line and circle symbols in FIG. 6A), and the output characteristics of a TFT device based on P3HT mixed with 10 weight percents of $C_{60}$ (dashed line and square symbols in FIG. 6B) and the same doped with 10 weight percent of $C_{60}F_{36}$ (full line and circle symbols in FIG. 6B).

As can be seen in FIG. 6A, mixing $C_{60}$ has a slight effect on the TFT characteristics, as compared to the pronounced effect which is observed when $C_{60}F_{36}$ is used as a dopant in the TFT device, which resemble those of a resistor rather than a gating device.

As can be seen in FIG. 6B, the conductivity of the sample doped with 10% $C_{60}F_{36}$ in P3HT is three orders of magnitude higher than that of the pristine P3HT TFT at the ON state, and the characteristic conductivity is calculated to be about $3\times10^{-2}$ S/cm.

Example 6

Solution-Processed p-Doped OSC—A General Procedure

For solution processing, the OSC and the halogenated fullerene derivative p-dopant, according to the embodiments of the present invention, are dissolved separately in a suitable solvent to afford a solution of about 20 mg/ml solution. The two solutions are preferably based on the same solvent (for example P3HT in 1,2-dichlorobenzene, DCB) or on two compatible solvents.

Thereafter the solutions are mixed in the appropriate ratio so as to arrive at the desired OSC to dopant weight ratio, such as a 80:20 OSC:dopant ratio. The mixture is stirred for more than 1 hour at 45° C. in an inert atmosphere glove box to ensure adequate mixing.

The active layer is deposited from solution either through spin-coating or printing followed by a drying stage at about 100° C. for 1 hour. Using the above parameters and spinning at about 1500 rpm the film is obtained at a thickness of about 70 nm. In order to obtain films of a different thickness or to use any printing technique, the solution concentration and viscosity are adjusted so as to be suitable for the selected technique and machinery, as these are well established and known in the art.

All process steps can be performed under inert atmosphere conditions.

Example 7

Vapor-Processed p-Doped OSC—A General Procedure

Vacuum sublimed films of the p-doped OSCs, according to some embodiments of the present invention, can be obtained by vapor deposition-based techniques.

Briefly, the halogenated fullerene derivative dopant and the OSC are placed in separate evaporation sources under vacuum for the exclusion of oxygen, moisture and air. The p-doped layer is obtained by co-evaporation of the two sources at a predetermined rate so as to arrive at the desired ratio therebetween. Alternatively, the halogenated fullerene derivative dopant and the OSC are mixed at the desired ratio and placed in one evaporation source, and thereafter the mixture is co-evaporated to achieve the p-doped film.

Doping through multilayer coatings, using, for example, the Langmuir-Blodgett, LB, technique or an equivalent technique, can be achieved by inserting monolayer or sub-monolayer of the halogenated fullerene derivative dopant in between monolayers of the OSC where the ratio of dopant monolayers to OSC monolayers defines the doping concentration. According to some embodiments of the present invention, the ratio is 80:20 OSC:dopant.

Example 8

P-type Doping of Organic Thin Films using Fluorinated $C_{60}$

Relying on the concept of electronic formulation, the use of $C_{60}F_{36}$ as p-type dopant in a cross-linked hole transporting polymer is demonstrated below.

Two cross-linking strategies have been tested: the first relies on a photoacid catalyst for the polymerization of oxetane side groups, and the second uses photo cycloaddition of cinnamic ester side groups (namely devoid of a catalyst).

Figure 7:
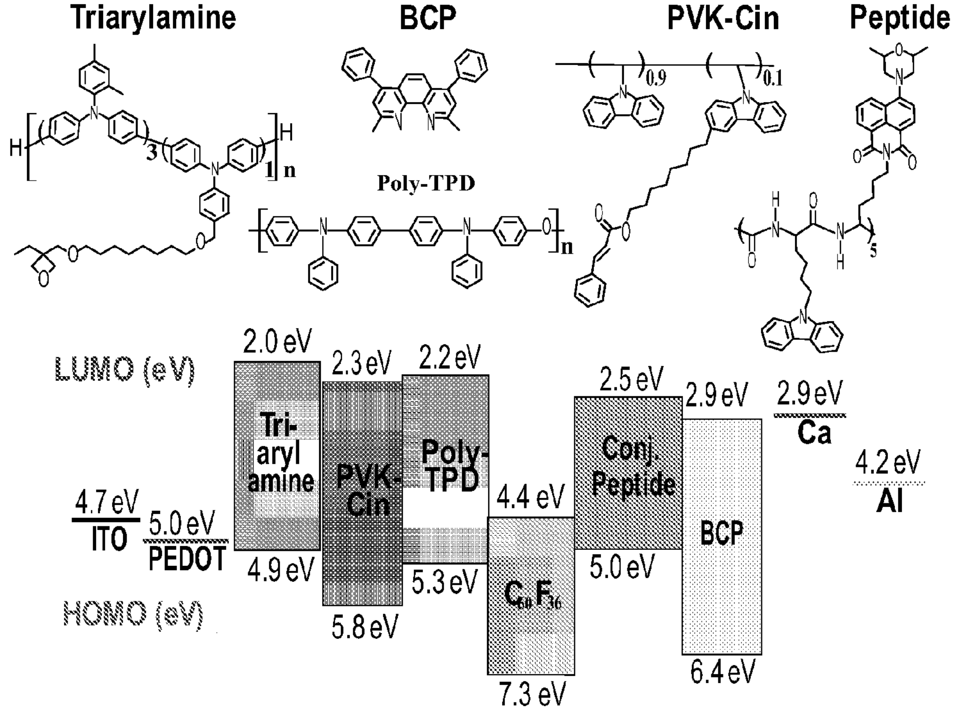
FIG. 7 presents a comparative energy level diagram and chemical structure of triarylamine, BCP, poly-TPD, PVK-Cin and a conjugated pentapeptide, which are the materials used in the study of p-type doping of organic thin films using the exemplary derivatized fullerene $C_{60}F_{36}$ according to some embodiments of the present invention, showing the HOMO-LUMO values as determines using cyclic voltammetry and compared to the values of indium tin oxide (ITO), (poly(3,4-ethylenedioxythiophene) (PEDOT), Ca and Al.

FIG. 7 presents a comparative energy level diagram and the chemical structures of triarylamine, BCP, poly-TPD, polyvinylcarbazole-cinnamate (PVK-Cin) and a conjugated pentapeptide, which are the materials used in the study of p-type doping of organic thin films using fluorinated $C_{60}$, according to some embodiments of the present invention, showing the HOMO-LUMO values as determines using cyclic voltammetry which are compared to the values of indium tin oxide (ITO), (poly(3,4-ethylenedioxythiophene) (PEDOT), Ca and Al.

Figure 8:
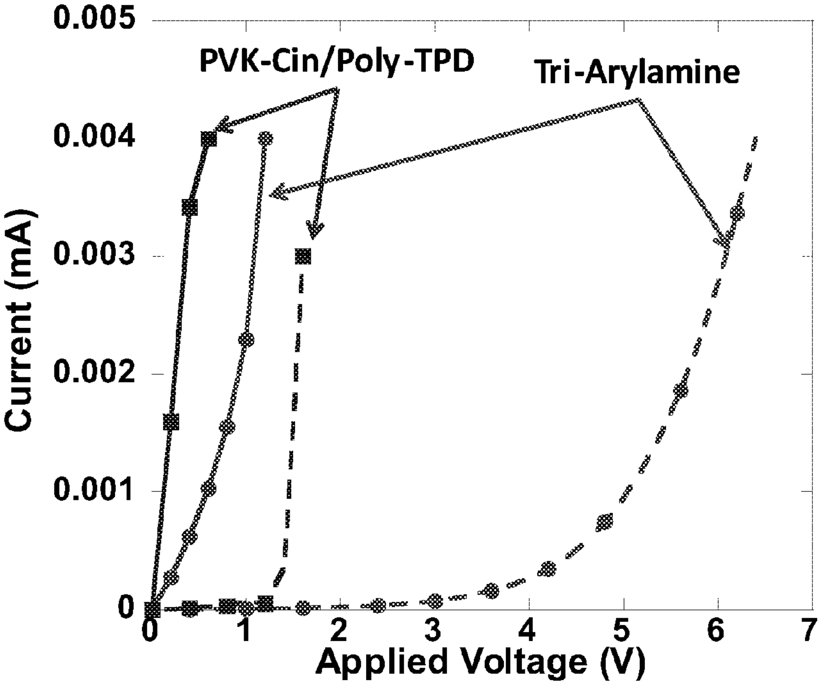
FIG. 8 presents a current vs. voltage plot, measured using ITO/PEDOT-70 nm polymer-silver diode structure, showing the characteristics of the cross-linked triarylamine (dashed line, round symbols), of the cross linked PVK-Cin blended at an equal weight with poly-TPD (dashed line, square symbols), and of the same materials where 10% by weight $C_{60}F_{36}$ was added thereto (solid lines in respective symbols)

FIG. 8 presents a current vs. voltage plot, measured using ITO/PEDOT-70 nm polymer-silver diode structure, showing the characteristics of the cross linked triarylamine (dashed line, round symbols), of the cross linked PVK-Cin blended at an equal weight with poly-TPD (dashed line, square symbols), and of the same materials where 10% by weight $C_{60}F_{36}$ was added thereto (solid lines in respective symbols).

As can be seen in FIG. 8, in both cases of triarylamine and the PVK-Cin/poly-TPD blend, adding $C_{60}F_{36}$ lowered the applied voltage per any given current in significant amount. In a separate study (not shown) it was found that the use of photoacid in the cross-linking scheme make the process highly sensitive to the conditions used (small amounts of residual catalyst are strong quenchers), hence the study was continued using the cinamate based photo cross-linking scheme.

Figure 9:
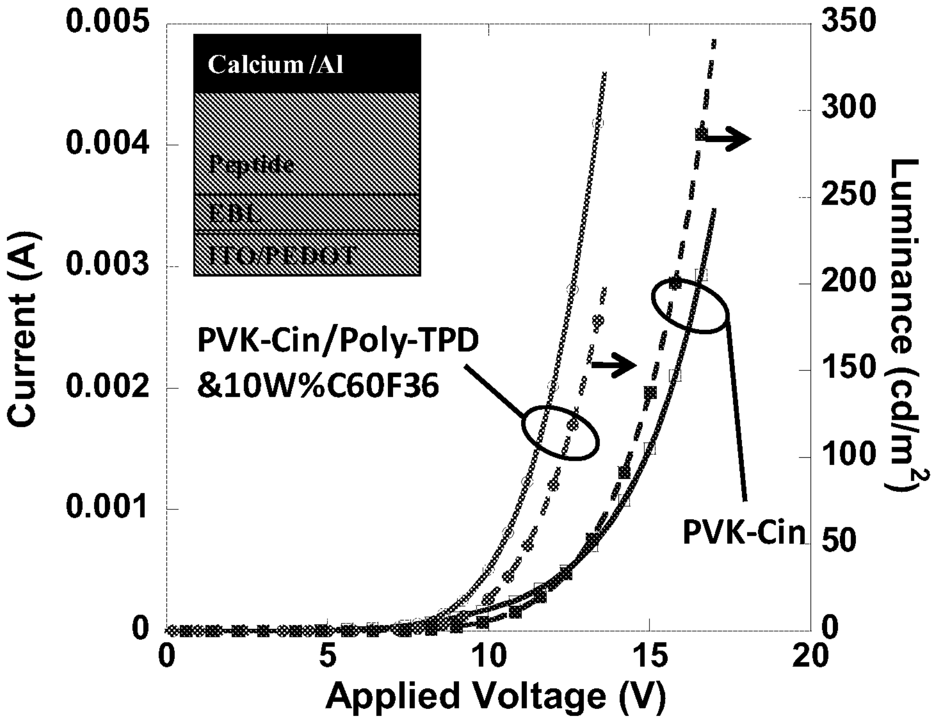
FIG. 9 presents a current vs. voltage (C-V) plot, showing the current and luminance as a function of applied voltage for double layer LEDs that are largely based on the carbazole unit of PVK that appears both in the electron blocking and in the emitter layer, wherein the results measured for the LED having electron blocking layer consisting of about 20 nm of undoped PVK-Cin are denoted by square symbols and the results measured for the LED having electron blocking layer consisting of about 70 nm of 10% by weight $C_{60}F_{36}$ doped into the PVK-Cin/poly-TPD 1:1 mixture are denoted by round symbols, and the light emitting conjugated pentapeptide layer was kept at a thickness of about 60 nm.

FIG. 9 presents a current vs. voltage (C-V) plot, showing the current and luminance as a function of applied voltage for double layer LEDs that are largely based on the carbazole unit of PVK that appears both in the electron blocking and in the emitter layer, wherein the results measured for the LED having electron blocking layer consisting of about 20 nm of undoped PVK-Cin are denoted by square symbols and the results measured for the LED having electron blocking layer consisting of about 70 nm of 10% by weight $C_{60}F_{36}$ doped into the PVK-Cin/poly-TPD 1:1 mixture are denoted by round symbols, and the light emitting conjugated pentapeptide layer was kept at a thickness of about 60 nm.

As can be seen in FIG. 9, the overall voltage required for the operation of this device was relatively high which is typical for PVK (carbazole) based LEDs. It is also noted that despite the tripling of electron blocking layer (EBL) thickness, the addition of 10% by weight $C_{60}F_{36}$ as p-type dopant reduced the voltage required to achieve 100 cd/m$^2$ by about 20%. As can further be seen in FIG. 9 the reduction of voltage is accompanied by a reduction of the EL quantum efficiency, presumably due to excess of holes being injected through the doped electron blocking layer.

Figure 10:
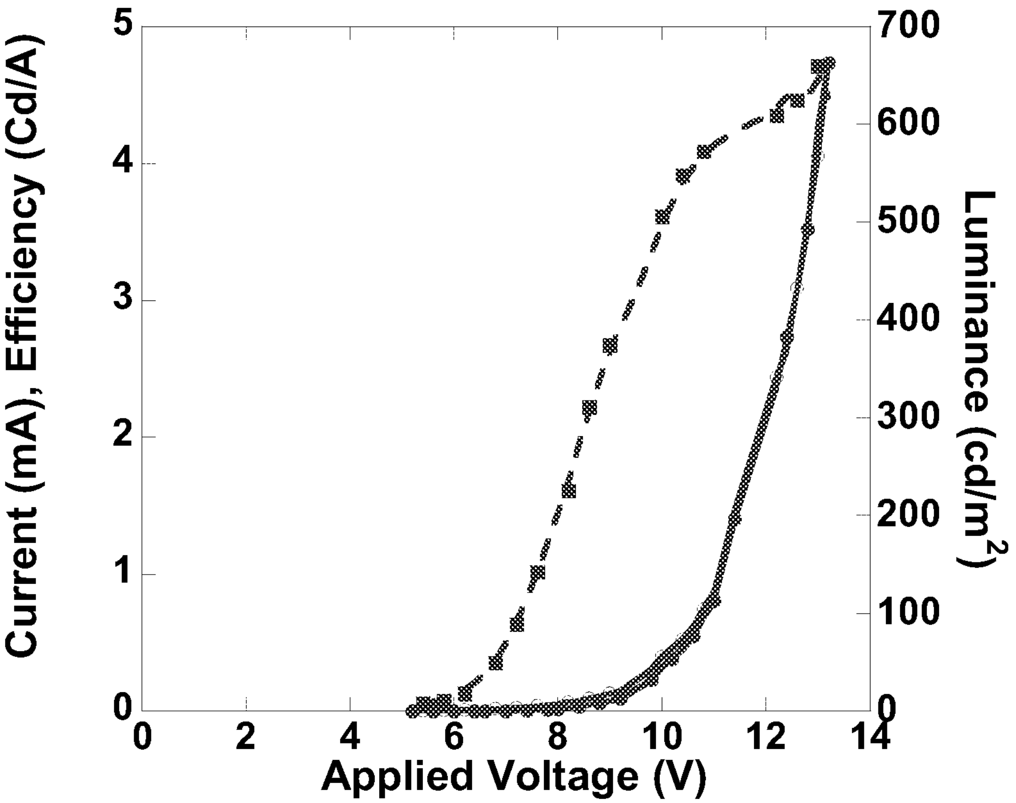
FIG. 10 presents a current vs. voltage (C-V) plot of the results obtained for a three layer hybrid LED, wherein the electron blocking layer (EBL) was of 70 nm and the conjugated pentapeptide emitter (20 nm) were spincoated from solution followed by evaporation of a 30 nm BCP as hole blocking layer (HBL) and a top contact metal (Ca/Al), showing the current and luminance, in solid and empty symbols in the overlapping lines, respectively, whereas the dashed line and square symbols represents the device efficiency in cd/A.

FIG. 10 presents a current vs. voltage (C-V) plot of the results obtained for a three layer hybrid LED, wherein the electron blocking layer (EBL) was of 70 nm and the conjugated pentapeptide emitter (20 nm) were spincoated from solution followed by evaporation of a 30 nm BCP as hole blocking layer (HBL) and a top contact metal (Ca/Al), showing the current and luminance, in solid and empty symbols in the overlapping lines, respectively, whereas the dashed line and square symbols represents the device efficiency in cd/A.

As can be seen in FIG. 10, the hybrid LED shows "turn on" voltage just below 6 V and efficiency that reaches about 4.5 cd/A at 650 cd/m$^2$.

Hence, it is shown hereinabove that $C_{60}F_{36}$ can successfully be incorporated into organic LEDs as a p-type dopant in cross-linked hole transporting polymers, and that the use of the p-type doped layers enabled the fabrication of hybrid LED having improved turn-on voltage and brightness. As the number of fluorine atoms attached to the $C_{60}$ is a controlled variable, it is stated that fluorinated $C_{60}$ constitute a tunable family of dopants in organic electronics according to embodiments of the present invention.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

References Cited by Numerals (Other References are Cited in the Text)

1. Blochwitz, J., et al., Applied Physics Letters, 1998. 73(6): p. 729-731.
2. Walzer, K., et al., Chemical Reviews, 2007. 107(4): p. 1233-1271.
3. Pfeiffer, M., et al., Appl. Phys. Lett., 1998. 73(22): p. 3202-3204.
4. Wöbkenberg, P. H., et al., App. Phy. Let., 2008. 92: p. 143310.
5. Dai, L., et al., Journal of Physical Chemistry B, 1998. 102(21): p. 4049-4053.
6. Sque, S. J., et al., Physica B-Condensed Matter, 2006. 376: p. 268-271.
7. Rincóna, M. E., et al., Solar Energy Materials and Solar Cells, 2005. 87(1-4): p. 33-47.
8. Sariciftci, N. S., et al., Synthetic Metals 1993. 59: p. 333-352.
9. Boltalina, O. V., et al., Chemical Communications, 1996 (4): p. 529-530.
10. Liu, N., et al., Synthetic Metals, 1997. 86(1-3): p. 2289-2290.
11. Pommerehe, J. et al., Adv. Mater. 1995, 7, 55
12. Brown, P. J., et al., Physical Review B, 2001. 63(12).
13. de Mello, J. C., et al., Adv. Mater., 1997. 9: p. 230
14. Shaked, S., et al., Advanced Materials, 2003. 15(11): p. 913-916.

What is claimed is:

1. A method of manufacturing a semiconductor material, the method comprising doping an organic semiconductor material with a fullerene derivative having at least one electron-withdrawing substituent covalently attached thereto, and having a lowest unoccupied molecular orbital (LUMO) at an energy level which is less than 1 eV above an energy level of a highest occupied molecular orbital (HOMO) of said organic semiconductor material, wherein an energy level of said LUMO of said fullerene derivative is lower than an energy level of a LUMO of a non-derivatized fullerene by at least 0.5 eV.

2. The method of claim 1, wherein said doping comprises mixing said organic semiconductor material with said fullerene derivative in solution so as to obtain a mixture thereof.

3. The method of claim 2, further comprising applying said mixture onto a substrate by a procedure selected from the group consisting of spin-coating, printing, vaporizing, dipping, and doctor-blading.

4. The method of claim 1, wherein said doping is effected by vapor deposition.

5. The method of claim 4, wherein said doping comprises co-evaporating and depositing said organic semiconductor material and said fullerene derivative from two separate sources onto a substrate.

6. The method of any of claim 4, wherein said doping comprises vapor depositing said fullerene derivative onto a pre-applied layer of said organic semiconductor material.

7. The method of claim 1, wherein a ratio of said organic semiconductor material to said fullerene derivative ranges from 80 to 20 percent by weight to 99.99 to 0.01 percent by weight.

8. The method of claim 1, wherein said fullerene derivative has general Formula I:

$$C_nR_m \quad \text{Formula I}$$

wherein n and m are integers representing the ratio of carbon atoms to R substituents in said fullerene;

R is an electron-withdrawing substituent; and wherein said fullerene is selected from the group consisting of a spherical fullerene, a tubular fullerene, a linear fullerene and a planar fullerene.

9. The method of claim 8, wherein said electron-withdrawing substituent is selected from the group consisting of halogen, pseudohalogen, haloalkyl, haloalicyclic, haloaryl, haloheteroaryl, carbonyl, ester, aldehyde and any combination thereof.

10. The method of claim 9, wherein said electron-withdrawing substituent is halo and said fullerene derivative is a halogenated fullerene derivative.

11. The method of claim 10, wherein said halogenated fullerene derivative is a halogenated spherical fullerene derivative.

12. The method of claim 11, wherein said halogenated spherical fullerene derivative is $C_{60}F_{36}$.

13. The method of claim 11, wherein said halogenated spherical fullerene derivative is $C_{70}F_{54}$.

14. A semiconductor composition, comprising an organic semiconductor material doped with a fullerene derivative having at least one electron-withdrawing substituent covalently attached thereto, and having a lowest unoccupied molecular orbital (LUMO) at an energy level which is less than 1 eV above an energy level of a highest occupied molecular orbital (HOMO) of said organic semiconductor material, wherein an energy level of said LUMO of said fullerene derivative is lower than an energy level of a LUMO of a non-derivatized fullerene by at least 0.5 eV.

15. The composition of claim 14, being in a liquid form.

16. The composition of claim 14, wherein a ratio of said organic semiconductor material to said fullerene derivative ranges from 80 to 20 percent by weight to 99.99 to 0.01 percent by weight.

17. The composition of claim 14, wherein said fullerene derivative has general Formula I:

$$C_nR_m \quad \text{Formula I}$$

wherein n and m are integers representing the ratio of carbon atoms to R substituents in said fullerene;

R is an electron-withdrawing substituent; and wherein said fullerene is selected from the group consisting of a spherical fullerene, a tubular fullerene, a linear fullerene and a planar fullerene.

18. The composition of claim 17, wherein said electron-withdrawing substituents is selected from the group consisting of halogen, pseudohalogen, haloalkyl, haloalicyclic, haloaryl, haloheteroaryl, carbonyl, ester, aldehyde and any combination thereof.

19. The composition of claim 18, wherein said electron-withdrawing substituent is halo and said fullerene derivative is a halogenated fullerene derivative.

20. The composition of claim 19, wherein said halogenated fullerene derivative is a halogenated spherical fullerene derivative.

21. The composition of claim 20, wherein said halogenated spherical fullerene derivative is $C_{60}F_{36}$.

22. The composition of claim 20, wherein said halogenated spherical fullerene derivative is $C_{70}F_{54}$.

23. An electronic device comprising the composition of claim 14.

24. The device of claim 23, selected from the group consisting of an eleetrooptical device, a solar (photovoltaic) cell, an electronic device, a component of an integrated circuitry, an organic light-emitting diode (OLED), a thin film transistor (TFT), a field-effect transistor (FET), a TFT in flat panel display device, an element in a liquid crystal display (LCD) device, a radio-frequency identification (RFID) device and a detector/sensor device.

* * * * *